(12) United States Patent
Okamura et al.

(10) Patent No.: US 7,095,895 B2
(45) Date of Patent: Aug. 22, 2006

(54) SEMICONDUCTOR INTEGRATED CIRCUIT FOR REALIZING CODING CIRCUIT

(75) Inventors: Jun-ichi Okamura, Tokyo (JP); Tatsuo Tsujita, Tokyo (JP)

(73) Assignee: Thine Electronics, Inc., Tokyo (JP)

( * ) Notice: Subject to any disclaimer, the term of this patent is extended or adjusted under 35 U.S.C. 154(b) by 717 days.

(21) Appl. No.: 10/296,328

(22) PCT Filed: Jan. 24, 2001

(86) PCT No.: PCT/JP01/00446

§ 371 (c)(1),
(2), (4) Date: Nov. 22, 2002

(87) PCT Pub. No.: WO01/91306

PCT Pub. Date: Nov. 29, 2001

(65) Prior Publication Data

US 2003/0184454 A1    Oct. 2, 2003

(51) Int. Cl.
*G06K 9/36* (2006.01)
*H03M 5/00* (2006.01)

(52) U.S. Cl. ......................... 382/232; 341/58

(58) Field of Classification Search ............... 382/145, 382/147, 151, 218, 219, 220, 232, 246; 341/58, 341/59, 73, 108; 713/167; 708/200, 400; 375/144, 245, 290, 292, 240.1, 240.2, 253
See application file for complete search history.

(56) References Cited

U.S. PATENT DOCUMENTS

| | | | | |
|---|---|---|---|---|
| 4,268,861 A | * | 5/1981 | Schreiber et al. | 375/240.1 |
| 4,800,440 A | * | 1/1989 | Kurokawa | 382/246 |
| 4,894,713 A | * | 1/1990 | Delogne et al. | 375/240.2 |
| 5,307,298 A | * | 4/1994 | Sawada | 708/200 |
| 5,432,513 A | * | 7/1995 | Okamoto | 341/108 |
| 6,026,124 A | | 2/2000 | Lee et al. | |
| 6,327,654 B1 | * | 12/2001 | Oowaki et al. | 713/167 |
| 2003/0184454 A1 | * | 10/2003 | Okamura et al. | 341/58 |

* cited by examiner

FOREIGN PATENT DOCUMENTS

JP        02-094922 A        4/1990

OTHER PUBLICATIONS

"Digital Visual Interface DVI", Rev. 1.0, Apr. 2, 1999, corresponding to Digital Display Working Group, pp. 24-32.

*Primary Examiner*—Amir Alavi
(74) *Attorney, Agent, or Firm*—Sughrue Mion, PLLC

(57) ABSTRACT

Provided is a circuit for implementing the coding of a DVI (Digital Visual Interface) standard in a small size of hardware, at high speed, and with low power consumption. In a DVI coding circuit, the input of a number-of-levels comparison circuit 22 for judging which of the number of bits at a level "H" and the number of bits at a level "L" is larger in the input signal of the coding circuit is set at 7 bits. The output of a number-of-transitions decrease circuit 23 for decreasing the number of the transitions between adjacent two bits can be inverted for 4 bits on the basis of the output of the number-of-levels comparison circuit 22. A DC balance circuit 24 for keeping the direct current-wise balance of the output signal of the coding circuit includes a 4-bit register 31, a number-of-levels difference computation circuit 27, a condition decision circuit 28, a bit inversion circuit 29 and an addition circuit 30. The number-of-levels difference computation circuit 27 receives as its inputs the 8 bits of the output of the number-of-transitions decrease circuit 23 and the 4 bits of the input signal of the coding circuit.

20 Claims, 14 Drawing Sheets

SEMICONDUCTOR INTEGRATED CIRCUIT FOR REALIZING CODING CIRCUIT this application is a 371 of PCT/JP01/00446 Jan. 24, 2001.

TECHNICAL FIELD

This invention relates to a coding circuit for transmitting a digital image signal at high speed.

BACKGROUND OF THE INVENTION

As one of high-speed transmission systems for digital image signals, there is the standard of DVI (Digital Visual Interface) (hereinbelow, this standard shall be referred to as "DVI standard", and the specification thereof shall be referred to as "DVI standard specification"). The DVI standard specification can be obtained from "http://www.d-dwg.org/downloads.html". A coding system which is handled in the present invention is stipulated on pages 28–29 in DVI standard specification Rev. 1.0 (hereinbelow, this coding system shall be termed "DVI coding system"). The circuits which form the foundation of the DVI coding system, are described in U.S. Pat. No. 6,026,124.

Shown in FIG. 1 is a flow chart of the DVI coding system.

The transmission system of DVI is a system wherein, on a transmission side, the 8-bit RGB (Red, Green, Blue) input signals of image data are respectively coded into 10-bit signals, the resulting parallel 10-bit data are respectively serialized, and four differential pair signals including a clock signal added to the serial data are transmitted.

The DVI coding system codes each 8-bit input signal into a 10-bit signal, thereby to minimize the probability of the transitions between adjacent two bits of the signal and also to balance a "H" level (hereinafter, also referred to as "1") and a "L" level (hereinafter, also referred to as "0"). Minimizing the probability of the transitions between adjacent two bits decreases the number of times when the data change over in the case where the parallel 10-bit data is serialized and transmitted, which is effective to decrease the emission of superfluous electromagnetic waves. Balancing the "H" level and the "L" level eliminates the inter-pair DC-wise deviation of the signals transmitted as differential pairs.

Concretely, in a unit time, an 8-bit image data signal D[0:7] is input for one character, and 10-bit data q_out[0:9] is output for one T.M.D.S. character. "T.M.D.S. (Transition Minimized Differential Signaling)" is a coding system which forms the foundation of the DVI standard, and the "T.M.D.S. character" signifies the coded data of 10 bits.

The coding is done when a signal DE is at the "H" level.

Cnt(t) is a content which is held in an internal register at time "t" in order to keep the balance between a number of "1" and a number of "0" in a plurality of successive T.M.D.S. characters, and it is obtained as the sum of a value calculated by subtracting a number of "0" from a number of "1" and a content Cnt(t−1) held in the internal register at time (t−1). For example, when the signal is "1011000001" at the time "t", a value, which is calculated in such a way that "−2" obtained by subtracting "6" as a number of "0" from "4" as a number of "1" is added to the content Cnt(t−1) held in the internal register at the time (t−1), becomes the value of the content Cnt(t).

By the way, in the figure, $N_1\{x\}$ indicates a formula which returns how many "1" are contained in a multi-bit variable "x". Likewise, $N_0\{x\}$ returns how many "0" are contained in the multi-bit variable "x". Further, q_m[] indicates a result produced by subjecting the 8-bit input signal D[0:7] to processing so as to decrease the number of the transitions between adjacent two bits thereof. The meaning of the number of the transitions between adjacent two bits will be explained, for example, in an 8-bit input signal "10010010". When this input signal is viewed rightwards in succession, there are 5 parts where a value transits from "1" to "0" or from "0" to "1", and hence, the number of the transitions between adjacent two bits is five. Besides, $q_{13}$ out[0:9] indicates a 10-bit coded output signal further subjected to processing for keeping a DC balance.

As shown at S101 in FIG. 1, according to the standard specification, in order to minimize the probability of the transitions of the signal, the number of bits at the "H" level in the 8-bit input signal needs to be counted so as to discriminate "a case where the number of bits at the "H" level is larger than 4, or a case where the 0th bit is at the "L" level and where the number of bits at the "H" level is 4" from any other case. In the case where the number of bits at the "H" level is smaller, the number of the transitions between adjacent two bits can be decreased by coding with use of XORs, as shown at S102 in the figure. Besides, in the case where the number of bits at the "H" level is larger, the number of the transitions between adjacent two bits can be decreased by coding with use of XNORs, as shown at S103 in the figure. A circuit which incarnates step S101 in the figure in the standard specification, can be realized by combining a bit slice adder 2 and a condition discrimination circuit 3 as shown in a circuit diagram of FIG. 2. However, this circuit expends a long time because the circuit has a large number of stages of gates through which signals must pass till the final result is obtained. For example, in conventional logic circuits of CMOS scheme, in the case of each of full adders FA (7–10), signals need to pass two stages of gates for obtaining a carry signal C, and signals need to pass three stages of gates for obtaining a sum signal S, and in case of each of half adders HA (4–6), signals need to pass two stages of gates for obtaining a carry signal C, and signals need to pass two stages of gates for obtaining a sum signal S. Therefore, signals need to pass at most ten stages of gates till arrival at the condition discrimination circuit 3. In order to obtain the final result, signals need to pass several further stages of gates in the condition discrimination circuit 3.

Besides, as shown at step S102 or S103 in FIG. 1, according to the DVI standard, the number of the transitions is decreased by executing the processing of taking XOR or XNOR between 0th bit and 1st bit of the input bits and thenceforth taking XORs or XNORs between such computed results and the neighboring bits, respectively. When interpreted as stipulated in the DVI standard specification, a circuit for the above processing becomes as shown in FIG. 3. In the circuit, XNORs 11a–11g and XORs 12a–12g are connected in parallel, and either of their results is selected by a selector 13 at a succeeding stage. Also this circuit is disadvantageous in that the circuit has a large number of stages of gates through which signals pass till the determination of the last bit.

Next, according to the DVI standard, a judgment for balancing an output code DC-wise is formed at steps S106 and S107 as shown in FIG. 1. Concretely, there are formed a judgment on whether the content Cnt(t−1) of the internal register at the time (t−1) is plus, minus or zero, and a judgment on whether a number of bits at the "H" level is larger, a number of bits at the "L" level is larger, or a number of bits at the "H" level is equal to a number of bits at the "L" level, after the number of bits at the "H" level and the number of bits at the "L" level have been counted as to the 8-bit signal q_m[0:7] subjected to the processing of decreasing the number of the transitions between adjacent two bits. In accordance with the results of the judgments, the value of the data q_out[0:9] to be output to keep the DC balance is determined, and the internal register is updated at steps S110–S113 as shown in FIG. 1. A circuit for conducting operation which is close to that of a circuit incarnating such processing is illustrated in FIG. 7B of U.S. Pat. No. 6,026,124. A simplified block diagram for explaining the operation of a circuit based on the illustrated circuit, is shown in FIG. 4. First, the signal q_m[0:7] which has been coded so as to decrease the number of the transitions between adjacent two bits is divided into sets each consisting of 2 bits. As to the respective bit sets, whether bit values are "11" or "00" is evaluated by "11"·"00" detection circuits 14a–14d. If the value of each set of 2 bits is "01" or "10", the DC balance is already kept within the 2 bits, and hence, the set is neglected. In accordance with the results of the evaluations, the numbers of "11" and "00" are respectively counted by counters 15 and 16. The differences between the counts of the two counters are computed by subtractors 17a, 17b, the computed results, the content of the internal register and the value of data q_m[8] are evaluated by a condition decision circuit 18. Either one of output values of the subtractors 17a and 17b is selected by a selector 19 on the basis of the evaluated result, and the sum of the selected value, the output value of the condition decision circuit 18 and the value of a 4-bit register 21 is calculated by a 4-bit adder 20, so as to update the content of the 4-bit register 21 and to output a signal q_out[9] which indicates whether or not the final coded result is to be inverted.

This circuit operates upon receiving the outputs of the circuits for decreasing the number of the transitions, and therefore has the disadvantage that a long time is expended till the obtainment of the final result.

The present invention has an object to overcome the above disadvantages in the DVI coding system, and to provide a circuit which implements the system in a small hardware size, at high speed and with low power consumption.

DISCLOSURE OF THE INVENTION

In order to solve the above problem, an invention defined in claim 1 consists in:

a semiconductor integrated circuit for realizing a coding circuit comprising a number-of-levels comparison circuit which receives an input signal of 8 bits so as to check statuses of the respective bits of the input signal and which decides whether a first status or a second status is larger in number, a number-of-transitions decrease circuit which receives an output of the number-of-levels comparison circuit and which decreases the number of transitions between adjacent two bits of the input signal, a DC balance circuit which receives an output of the number-of-transitions decrease circuit and the output of the number-of-levels comparison circuit so as to keep balance between the numbers of the first status and the second status in an output signal of 10 bits, and an output inversion circuit which receives an output of the DC balance circuit and which inverts the 8-bit output of the number-of-transitions decrease circuit, characterized in that:

said number-of-levels comparison circuit receives an input of 7 bits in the input signal, and that it changes-over a status of its output between in a case where the number of the bits in the first status is at least 4 in the 7-bit input signal, and in a case where the number of the bits in the first status is at most 3.

Here, the "first status" indicates either of a level "H" and a level "L", while the "second status" indicates the other of the level "H" and the level "L".

In a prior-art circuit, an input signal of 8 bits is received so as to judge a condition, and to change-over the status of an output, whereas in the system of the present invention, an equivalent function can be incarnated with the 7 bits, so that the method of the invention can be made advantageous over a prior-art method in points of a circuit area and power consumption.

An invention defined in claim 2 consists in:

a semiconductor integrated circuit for realizing a coding circuit comprising a number-of-levels comparison circuit which receives an input signal of 8 bits so as to check statuses of the respective bits of the input signal and which decides whether a first status or a second status is larger in number, a number-of-transitions decrease circuit which receives an output of the number-of-levels comparison circuit and which decreases the number of transitions between adjacent two bits of the input signal, a DC balance circuit which receives an output of the number-of-transitions decrease circuit and the output of the number-of-levels comparison circuit so as to keep balance between the numbers of the first status and the second status in an output signal of 10 bits, and an output inversion circuit which receives an output of the DC balance circuit and which inverts the 8-bit output of the number-of-transitions decrease circuit, characterized in that:

said number-of-transitions decrease circuit includes a bit inversion circuit which receives the output of said number-of-levels comparison circuit and which inverts 4 bits in the 8-bit output.

Besides, an invention defined in claim 3 consists in:

a semiconductor integrated circuit as defined in claim 1, characterized in that said number-of-transitions decrease circuit includes a bit inversion circuit which receives the output of said number-of-levels comparison circuit and which inverts 4 bits in the 8-bit output.

The output of the number-of-transitions decrease circuit which decreases the number of the transitions between adjacent two bits can have its 4 bits inverted on the basis of the output of the number-of-levels comparison circuit.

Thus, the circuit having a function equivalent to that of the prior-art circuit can be realized with a circuit scale of approximately half, so that the method of the invention can be made advantageous over the prior-art method in points of a circuit area and power consumption.

An invention defined in claim 4 consists in:

a semiconductor integrated circuit for realizing a coding circuit comprising a number-of-levels comparison circuit which receives an input signal of 8 bits so as to check statuses of the respective bits of the input signal and which decides whether a first status or a second status is larger in number, a number-of-transitions decrease circuit which receives an output of the number-of-levels comparison circuit and which decreases the number of transitions between adjacent two bits of the input signal, a DC balance circuit which receives an output of the number-of-transitions decrease circuit and the output of the number-of-levels comparison circuit so as to keep balance between the numbers of the first status and the second status in an output signal of 10 bits, and an output inversion circuit which receives an output of the DC balance circuit and which inverts the 8-bit output of the number-of-transitions decrease circuit, characterized in that:

said DC balance circuit includes a register which serves to store a hysteresis of a half of a difference between the numbers of the bits in the first status and in the second status in an output of said coding circuit, to the amount of 4 bits, a number-of-levels difference computation circuit which serves to compute a half of a difference between the numbers of the bits in the first status and in the second status in the output of said number-of-transitions decrease circuit, a condition decision circuit which receives the output of said number-of-levels comparison circuit, an output of said register and an output of said number-of-levels difference computation circuit so as to create a signal for inverting the output of said number-of-levels difference computation circuit, a bit inversion circuit which receives the output of said condition decision circuit so as to invert the output of said number-of-levels difference computation circuit, and an addition circuit which computes a sum of the output of said number-of-levels comparison circuit, the output of said register and an output of said bit inversion circuit and which delivers the computed sum to said register.

Besides, an invention defined in claim 5 consists in:

a semiconductor integrated circuit as defined in any one of claims 1–3, characterized in that said DC balance circuit includes a register which serves to store a hysteresis of a half of a difference between the numbers of the bits in the first status and in the second status in an output of said coding circuit, to the amount of 4 bits, a number-of-levels difference computation circuit which serves to compute a half of a difference between the numbers of the bits in the first status and in the second status in the output of said number-of-transitions decrease circuit, a condition decision circuit which receives the output of said number-of-levels comparison circuit, an output of said register and an output of said number-of-levels difference computation circuit so as to create a signal for inverting the output of said number-of-levels difference computation circuit, a bit inversion circuit which receives the output of said condition decision circuit so as to invert the output of said number-of-levels difference computation circuit, and an addition circuit which computes a sum of the output of said number-of-levels comparison circuit, the output of said register and an output of said bit inversion circuit and which delivers the computed sum to said register.

According to the prior-art system, a condition decision circuit needs to pass two judgments for the purpose of determining a value which is given to an addition circuit. In contrast, according to the system of the present invention, the condition decision circuit may judge only one condition as to whether or not the bit inversion circuit performs the inversion, whereby the value to be given to the addition circuit is obtained.

Moreover, according to the prior-art system, a number-of-levels difference computation circuit requires two subtraction circuits for calculating the difference of the number of bits in the first status from the number of bits in the second status and the difference of the number of bits in the second status from the number of bits in the first status. In contrast, according to the present invention, owing to the use of the bit inversion circuit, it suffices to dispose only one subtraction circuit for calculating the half of the difference between the numbers of the bits in the first status and in the second status. Accordingly, the condition decision circuit and the number-of-levels difference computation circuit can be realized in a smaller circuit scale than in the prior-art system, so that the system of the invention can be made advantageous over the prior-art system in points of a circuit area and power consumption.

An invention defined in claim 6 consists in:

a semiconductor integrated circuit for realizing a coding circuit comprising a number-of-levels comparison circuit which receives an input signal of 8 bits so as to check statuses of the respective bits of the input signal and which decides whether a first status or a second status is larger in number, a number-of-transitions decrease circuit which receives an output of the number-of-levels comparison circuit and which decreases the number of transitions between adjacent two bits of the input signal, a DC balance circuit which receives an output of the number-of-transitions decrease circuit and the output of the number-of-levels comparison circuit so as to keep balance between the numbers of the first status and the second status in an output signal of 10 bits, and an output inversion circuit which receives an output of the DC balance circuit and which inverts the 8-bit output of the number-of-transitions decrease circuit, characterized in that:

said DC balance circuit includes a number-of-levels difference computation circuit which serves to compute a half of a difference between the numbers of the bits in the first status and in the second status in the output of said number-of-transitions decrease circuit, and that an input of said number-of-levels difference computation circuit is added to the output of said number-of-transitions decrease circuit and corresponds to 4 bits among 8 bits of an input signal of said number-of-transitions decrease circuit.

Besides, an invention defined in claim 7 consists in:

a semiconductor integrated circuit as defined in any one of claims 1–5, characterized in that an input of said number-of-levels difference computation circuit is added to the output of said number-of-transitions decrease circuit and corresponds to 4 bits among 8 bits of an input signal of said number-of-transitions decrease circuit.

According to the prior-art system, the number-of-levels difference computation circuit computes by receiving only the output of a number-of-transitions decrease circuit, and hence, the computation of the number-of-levels difference computation circuit is started for some signal patterns after the obtainment of the computed result of the number-of-transitions decrease circuit, so that a long time is required till the obtainment of the computed result of the number-of-levels difference computation circuit. In contrast, according to the system of the present invention, the computation of a path requiring the longest time is previously ended to an intermediate part before the obtainment of the output result of the number-of-transitions decrease circuit, by the use of the 4 bits among the 8 bits of the input of the number-of-transitions decrease circuit, whereby the computed result can be obtained in a shorter delay time than in the prior-art system.

An invention defined in claim 8 consists in:

a semiconductor integrated circuit for realizing a coding circuit comprising a number-of-levels comparison circuit which receives an input signal of 8 bits so as to check statuses of the respective bits of the input signal and which decides whether a first status or a second status is larger in number, a number-of-transitions decrease circuit which receives an output of the number-of-levels comparison circuit and which decreases the number of transitions between adjacent two bits of the input signal, a DC balance circuit which receives an output of the number-of-transitions decrease circuit and the output of the number-of-levels comparison circuit so as to keep balance between the numbers of the first status and the second status in an output signal of 10 bits, and an output inversion circuit which receives an output of the DC balance circuit and which inverts the 8-bit output of the number-of-transitions decrease circuit, characterized in that:

said number-of-transitions decrease circuit includes a first circuit which decreases the number of the transitions between adjacent two bits in a case where the number of the bits in the first status is larger in the 8-bit input signal, a second circuit which decreases the number of the transitions between adjacent two bits in a case where the number of the bits in the second status is larger, and a selector which receives the output of said number-of-levels comparison circuit so as to change-over outputs of said first circuit and said second circuit, and that said first circuit or/and said second circuit perform(s) parallel processing, thereby to decrease the number of stages of XOR gates or XNOR gates which are connected in series.

Besides, an invention defined in claim 9 consists in:

a semiconductor integrated circuit as defined in any one of claims 1 and 4–7, for realizing a coding circuit comprising a number-of-levels comparison circuit which receives an input signal of 8 bits so as to check statuses of the respective bits of the input signal and which decides whether a first status or a second status is larger in number, a number-of-transitions decrease circuit which receives an output of the number-of-levels comparison circuit and which decreases the number of transitions between adjacent two bits of the input signal, a DC balance circuit which receives an output of the number-of-transitions decrease circuit and the output of the number-of-levels comparison circuit so as to keep balance between the numbers of the first status and the second status in an output signal of 10 bits, and an output inversion circuit which receives an output of the DC balance circuit and which inverts the 8-bit output of the number-of-transitions decrease circuit, characterized in that:

said number-of-transitions decrease circuit includes a first circuit which decreases the number of the transitions between adjacent two bits in a case where the number of the bits in the first status is larger in the 8-bit input signal, a second circuit which decreases the number of the transitions between adjacent two bits in a case where the number of the bits in the second status is larger, and a selector which receives the output of said number-of-levels comparison circuit so as to change-over outputs of said first circuit and said second circuit, and that said first circuit or/and said second circuit perform(s) parallel processing, thereby to decrease the number of stages of XOR gates or XNOR gates which are connected in series.

Besides, an invention defined in claim 10 consists in:

a semiconductor integrated circuit for realizing a coding circuit comprising a number-of-levels comparison circuit which receives an input signal of 8 bits so as to check statuses of the respective bits of the input signal and which decides whether a first status or a second status is larger in number, a number-of-transitions decrease circuit which receives an output of the number-of-levels comparison circuit and which decreases the number of transitions between adjacent two bits of the input signal, a DC balance circuit which receives an output of the number-of-transitions decrease circuit and the output of the number-of-levels comparison circuit so as to keep balance between the numbers of the first status and the second status in an output signal of 10 bits, and an output inversion circuit which receives an output of the DC balance circuit and which inverts the 8-bit output of the number-of-transitions decrease circuit, characterized in that:

said number-of-transitions decrease circuit includes a first circuit which decreases the number of the transitions between adjacent two bits in a case where the number of the bits in the first status is larger in the 8-bit input signal, or a second circuit which decreases the number of the transitions between adjacent two bits in a case where the number of the bits in the second status is larger, and a bit inversion circuit which receives the output of said number-of-levels comparison circuit so as to invert 4 bits among 8 bits of an output of said first circuit or said second circuit, and that said first circuit, said second circuit or said first circuit performs parallel processing, thereby to decrease the number of stages of XOR gates or XNOR gates which are connected in series.

Besides, an invention defined in claim 11 consists in:

a semiconductor integrated circuit as defined in any one of claims 1–7, for realizing a coding circuit comprising a number-of-levels comparison circuit which receives an input signal of 8 bits so as to check statuses of the respective bits of the input signal and which decides whether a first status or a second status is larger in number, a number-of-transitions decrease circuit which receives an output of the number-of-levels comparison circuit and which decreases the number of transitions between adjacent two bits of the input signal, a DC balance circuit which receives an output of the number-of-transitions decrease circuit and the output of the number-of-levels comparison circuit so as to keep balance between the numbers of the first status and the second status in an output signal of 10 bits, and an output inversion circuit which receives an output of the DC balance circuit and which inverts the 8-bit output of the number-of-transitions decrease circuit, characterized in that:

said number-of-transitions decrease circuit includes a first circuit which decreases the number of the transitions between adjacent two bits in a case where the number of the bits in the first status is larger in the 8-bit input signal, or a second circuit which decreases the number of the transitions between adjacent two bits in a case where the number of the bits in the second status is larger, and a bit inversion circuit which receives the output of said number-of-levels comparison circuit so as to invert 4 bits among 8 bits of an output of said first circuit or said second circuit, and that said first circuit, said second circuit or said first circuit performs parallel processing, thereby to decrease the number of stages of XOR gates or XNOR gates which are connected in series.

Further, an invention defined in claim 12 consists in:

a semiconductor integrated circuit as defined in any one of claims 8–11, characterized in that the number of the stages of those XOR gates or XNOR gates of said first circuit or said second circuit which are connected in series is at most 3.

In the prior art, the result is not calculated unless 7 stages of XOR gates or XNOR gates are passed, whereas the invention is permitted to decrease the number of the stages by performing the parallel processing. Thus, the output can be calculated in a shorter delay time.

DESCRIPTION OF REFERENCE NUMERALS

Figure 1:
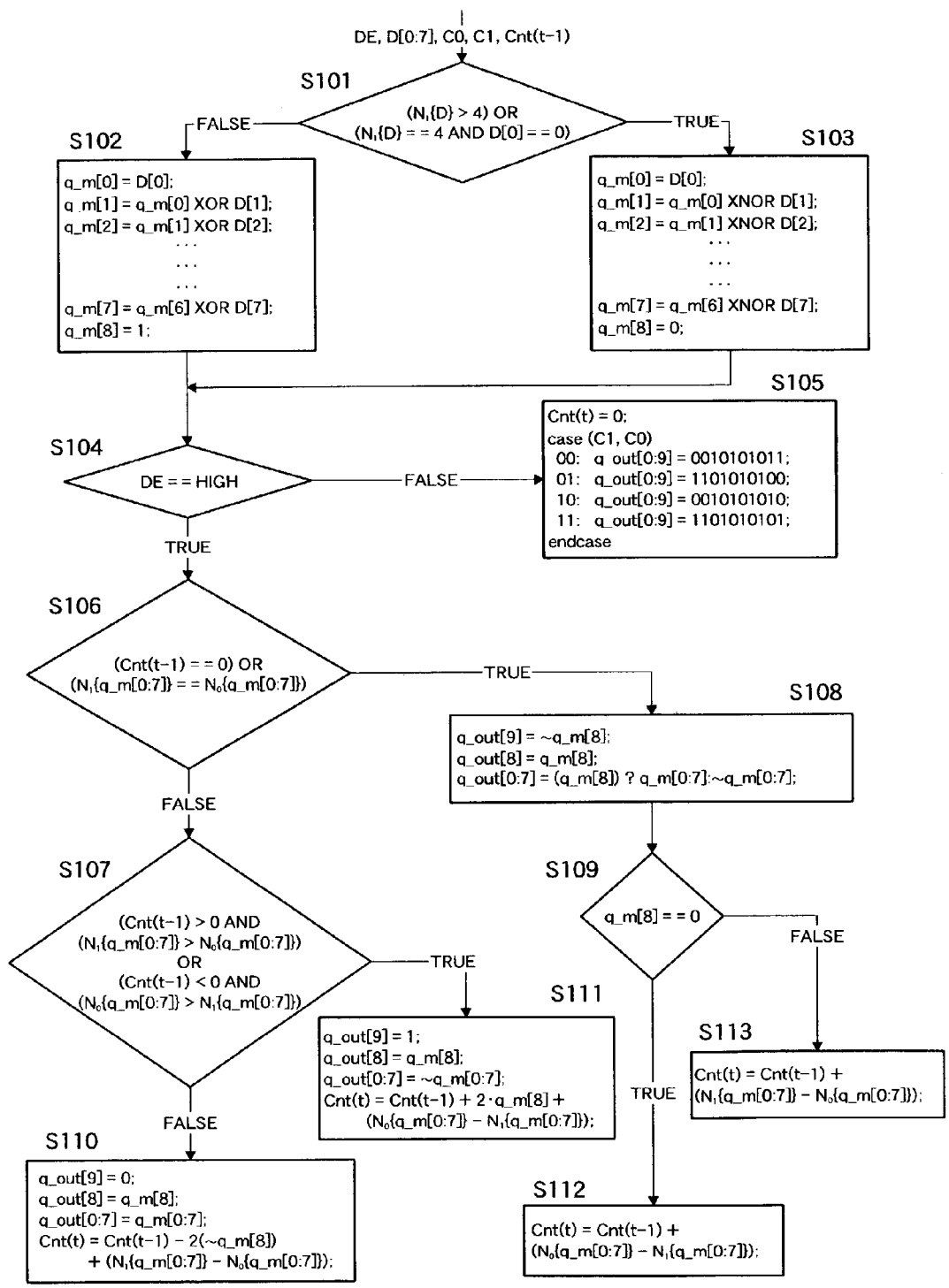
FIG. 1 is a flow chart of coding which is based on page 29 of the standard specification of DVI (Digital Visual Interface).
Figure 2:
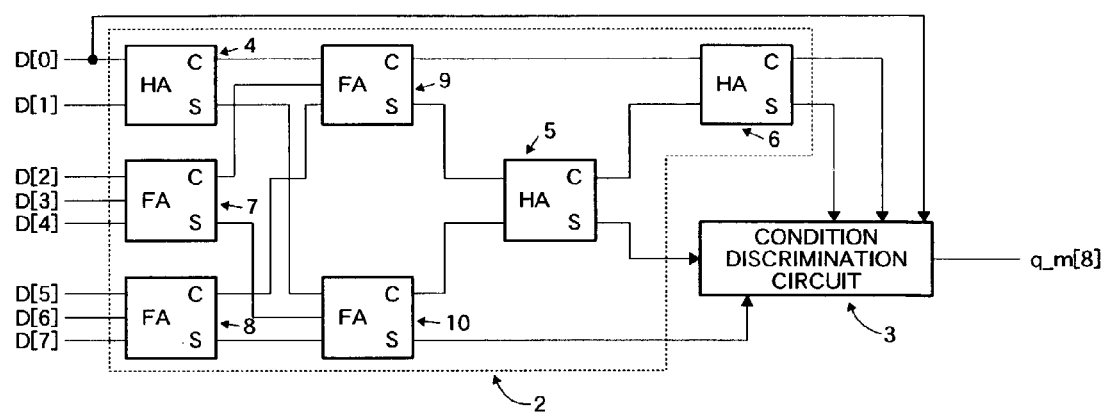
FIG. 2 shows the number-of-levels comparison circuit of a DVI-standard coder in the prior art.

22 Number-of-levels comparison circuit
23 Number-of-transitions decrease circuit
24 DC balance circuit
25 Output inversion circuit
26 Bit inversion circuit
27 Number-of-levels difference computation circuit
28 Condition decision circuit
29 Bit inversion circuit
30 Addition circuit
31 4-bit register

BEST MODE FOR CARRYING OUT THE INVENTION

A detailed algorithm will be first elucidated by referring a flow chart, and contrivances for installing the algorithm on a circuit will be thereafter described in detail.

[Flow Chart]

Figure 9:
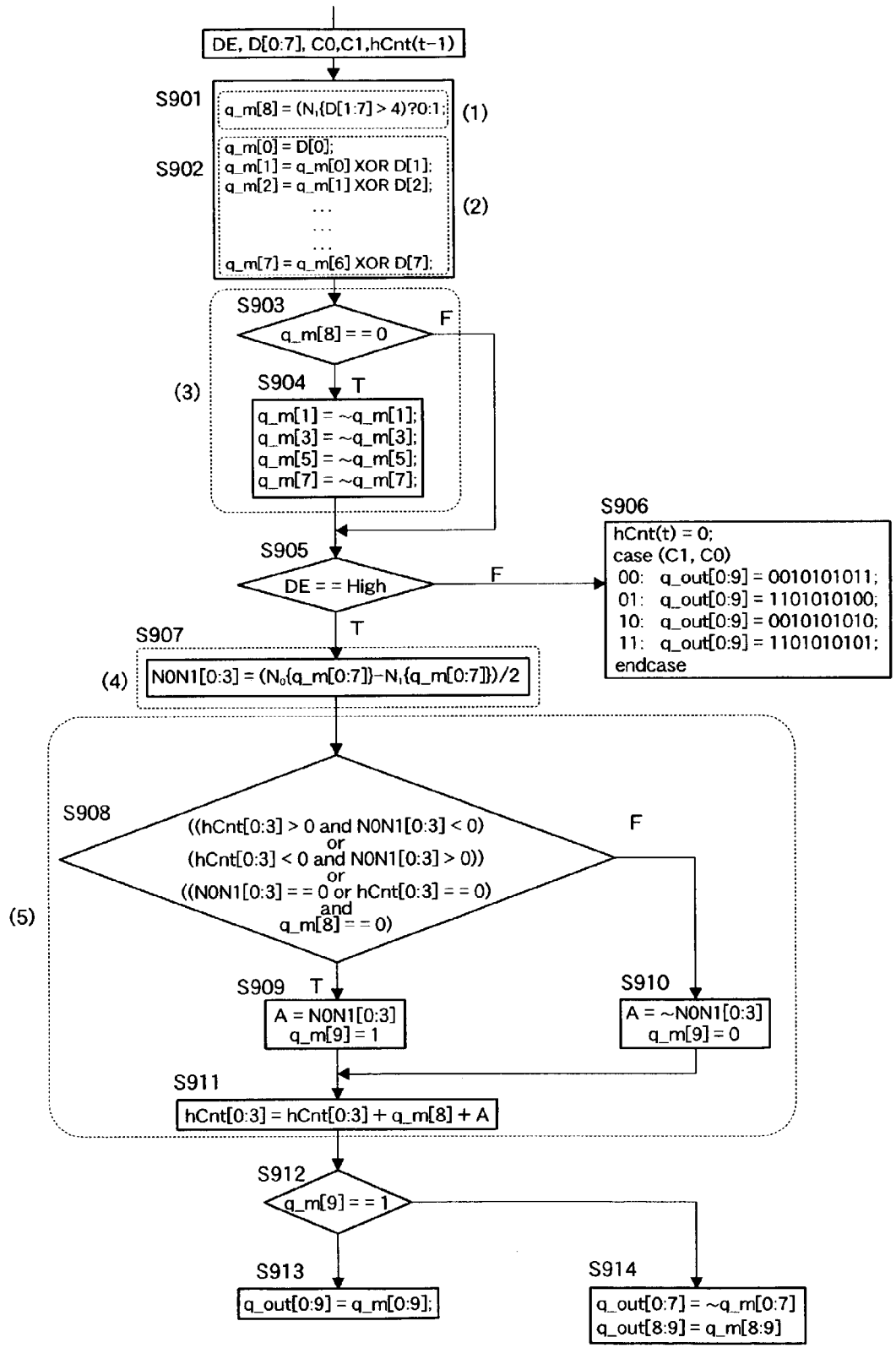
FIG. 9 is a flow chart of the whole coder in the present invention.

The present invention has been made upon finding out the fact that a flow which is logically equivalent to the flow of the flow chart of the DVI coding system as shown in FIG. 1 can be expressed by a flow chart as shown in FIG. 9, and with notice taken of the fact that, in a case where a circuit is arranged on the basis of the flow chart in FIG. 9, an efficiency is higher than in a case where the DVI coding system in FIG. 1 is directly turned into a circuit, so the circuit of a smaller number of hardware resources, higher speed and lower power consumption can be realized. When the flow chart as shown in FIG. 9 is simply compared with the flow chart as shown in FIG. 1, it is understood that the number of processing steps, which are executed on the occasions of branches, is decreased in the former by sharing sharable parts to the utmost, so the former can be incarnated by a smaller number of hardware resources.

First, steps S101–S103 in FIG. 1 can be replaced with steps S901–S904 in FIG. 9.

[Explanation of S901]

Step S901 is a part of executing processing in which step S101 in FIG. 1 and the steps of substituting the values of the data q_m[8] at steps S102 and S103 are put together. The condition judgment which is executed at step S101 can be made more efficient by setting a condition as shown at step S901.

More specifically, in accordance with the DVI standard as it is, the following discriminant condition is used:

$$(N_1\{D\}>4) \text{ OR } (N_1\{D\}==4 \text{ AND } D[0]==0)$$

In contrast, at step S901 in the present invention, the following quite equivalent condition is used:

$$N_1\{D[1:7]\}>=4$$

[Explanation of S902–S904]

Step S902 calculates the data q_m[0:7] in conformity with the same formula as at step S102 (however, a practicable circuit implementation is made more efficient, and this will be described later). Also, step S902 can be altered so as to use the same formula as at step S103, not at step S102.

Next, there will be described a part where steps S902–S904 are put together.

The circuit which is realized as conforms to FIG. 1 includes an encoder (S102) employing XORs correspondent to 8 bits, an encoder (S103) employing XNORs correspondent to 8 bits, and an 8-bit selector (S101) for selecting the result of either of the two encoders.

This circuit, however, can be constructed only of the encoder employing the XORs correspondent to 8 bits, and an inversion circuit correspondent to 4 bits. The reason therefor is that the following holds:

(result of encoder employing XORs correspondent to 8 bits)+(4-bit inversion)=(result of encoder employing XNORs correspondent to 8 bits)

Concretely, for $(N_1\{D[7:1]\}>=4)$, there hold:

$$q\_m[0] = D[0]$$
$$q\_m[1] = \overline{q\_m[0] \oplus D[1]}$$
$$q\_m[2] = \overline{q\_m[1] \oplus D[2]}$$
$$\vdots$$
$$q\_m[7] = \overline{q\_m[6] \oplus D[7]}$$
$$q\_m[8] = 0$$

These equations are written down as follows:

$$q\_m[0] = D[0] \tag{1}$$
$$q\_m[1] = \overline{D[1] \oplus D[0]}$$
$$q\_m[2] = \overline{D[2] \oplus \overline{D[1] \oplus D[0]}}$$
$$q\_m[3] = \overline{D[3] \oplus \overline{D[2] \oplus \overline{D[1] \oplus D[0]}}}$$
$$q\_m[4] = D[4] \oplus \overline{D[3] \oplus \overline{D[2] \oplus \overline{D[1] \oplus D[0]}}}$$
$$q\_m[5] = D[5] \oplus D[4] \oplus \overline{D[3] \oplus \overline{D[2] \oplus \overline{D[1] \oplus D[0]}}}$$

-continued $$q\_m[6] = D[6] \oplus D[5] \oplus D[4] \oplus D[3] \oplus D[2] \oplus \overline{\overline{D[1] \oplus D[0]}}$$

$$q\_m[7] = D[7] \oplus D[6] \oplus D[5] \oplus D[4] \oplus D[3] \oplus \overline{D[2] \oplus \overline{D[1] \oplus D[0]}}$$

$$q\_m[8] = 0$$

Here, by utilizing the fact that the relation of:

$$\overline{A \oplus \overline{B \oplus C}} = A \oplus B \oplus C$$

holds for an even number of times of XNORS, Eqs. (1) can be reduced as follows:

$$q\_m[0] = D[0] \quad (2)$$
$$q\_m[1] = \overline{D[1] \oplus D[0]}$$
$$q\_m[2] = D[2] \oplus D[1] \oplus D[0]$$
$$q\_m[3] = \overline{D[3] \oplus D[2] \oplus D[1] \oplus D[0]}$$
$$q\_m[4] = D[4] \oplus D[3] \oplus D[2] \oplus D[1] \oplus D[0]$$
$$q\_m[5] = \overline{D[5] \oplus D[4] \oplus D[3] \oplus D[2] \oplus D[1] \oplus D[0]}$$
$$q\_m[6] = D[6] \oplus D[5] \oplus D[4] \oplus D[3] \oplus D[2] \oplus D[1] \oplus D[0]$$
$$q\_m[7] = \overline{D[7] \oplus D[6] \oplus D[5] \oplus D[4] \oplus D[3] \oplus D[2] \oplus D[1] \oplus D[0]}$$
$$q\_m[8] = 0$$

On the other hand, for ($N_1\{D[7:1]\}<4$), there hold:

$$q\_m[0] = D[0]$$
$$q\_m[1] = q\_m[0] \oplus D[1]$$
$$q\_m[2] = q\_m[1] \oplus D[2]$$
$$\vdots$$
$$q\_m[7] = q\_m[6] \oplus D[7]$$
$$q\_m[8] = 1$$

These equations are written down as follows:

$$q\_m[0] = D[0] \quad (3)$$
$$q\_m[1] = D[1] \oplus D[0]$$
$$q\_m[2] = D[2] \oplus D[1] \oplus D[0]$$
$$q\_m[3] = D[3] \oplus D[2] \oplus D[1] \oplus D[0]$$
$$q\_m[4] = D[4] \oplus D[3] \oplus D[2] \oplus D[1] \oplus D[0]$$
$$q\_m[5] = D[5] \oplus D[4] \oplus D[3] \oplus D[2] \oplus D[1] \oplus D[0]$$
$$q\_m[6] = D[6] \oplus D[5] \oplus D[4] \oplus D[3] \oplus D[2] \oplus D[1] \oplus D[0]$$

-continued
$$q\_m[7] = D[7] \oplus D[6] \oplus D[5] \oplus D[4] \oplus D[3] \oplus D[2] \oplus D[1] \oplus D[0]$$
$$q\_m[8] = 1$$

When Eqs. (2) and (3) are compared, mere differences are that, except for the data q_m[8], the components of 4 bits with odd-numbered suffixes are inverted.

It is therefore understood sufficient that the data q_m[0:8] is obtained by executing only the computations of the XORs at step S102 in FIG. 1, without executing the classification of the cases at step S101 and the computations at step S103, whereupon the computations of steps S903 and S904 in FIG. 9 are executed.

As thus far described, in the present invention, steps S101–S103 in FIG. 1 in the prior art are replaced with steps S901–S904 in FIG. 9.

[Explanation of S905 and S906]

Steps S905 and S906 in FIG. 9 are respectively the same as steps S104 and S105 in FIG. 1.

[Explanation of S907–S914]

Steps S907–S914 in FIG. 9 correspond to steps S106–S113 in FIG. 1.

According to steps S110–S113, in order to update the counts of the counters, the following four equations need to be properly used depending upon conditions:

$$Cnt(t)=Cnt(t-1)+N_1-N_0-2(\sim q\_m[8])$$

$$Cnt(t)=Cnt(t-1)+N_0-N_1+2 \cdot q\_m[8]$$

$$Cnt(t)=Cnt(t-1)+N_1-N_0$$

$$Cnt(t)=Cnt(t-1)-N_1+N_0$$

Here, $N_1$ and $N_0$ shall denote $N_1\{q\_m[0:7]\}$ and $N_0\{q\_m[0:7]\}$, respectively. Since q_m[8] is "0" or "1", these equations become:

$$Cnt(t)=Cnt(t-1)+N_1-N_0-2$$

$$Cnt(t)=Cnt(t-1)+N_0-N_1+2$$

$$Cnt(t)=Cnt(t-1)+N_1-N_0$$

$$Cnt(t)=Cnt(t-1)-N_1+N_0$$

Here, Cnt/2 is replaced with hCnt by utilizing the fact that the subtraction of n bits in a binary number can be expressed by an operation employing a complement, as follows:

$$-A=\sim A+1$$

and the fact that the difference between $N_0$ and $N_1$ infallibly becomes an even number, so the whole equation can be divided by 2. Then, the following equations are obtained:

$$hCnt(t)=hCnt(t-1)+\sim N_0N_1$$

$$hCnt(t)=hCnt(t-1)+N_0N_1+1$$

$$hCnt(t)=hCnt(t-1)+\sim N_0N_1+1$$

$$hCnt(t)=hCnt(t-1)+N_0N_1$$

Here, $N_0N_1=(N_0-N_1)/2$ is held. Therefore, the computation of the counter values hCnt can be incarnated by the three operations of full inversion, 1-bit addition and full addition.

Next, the computations of the individual conditions at steps S110–S113 will be studied in detail. At step S110, the following computation is executed:

$$hCnt(t)=hCnt(t-1)-N_0N_1-(\sim q\_m[8])=hCnt(t-1)+\sim N_0N_1+1-(\sim q\_m[8])$$

Here, the last term; 1−(~q_m[8]) becomes "0" for q_m[8]=0 and "1" for q_m[8]=1, and it can be replaced with q_m[8], so that the above formula can be expressed as:

$$hCnt(t)=hCnt(t-1)+\sim N_0N_1+q\_m[8]$$

Subsequently, the computation of step S111 becomes:

$$hCnt(t)=hCnt(t-1)+N_0N_1+q\_m[8]$$

Subsequently, regarding step S112, the computation becomes:

$$hCnt(t)=hCnt(t-1)+N_0N_1$$

As seen from step S109, the condition of step S112 is executed when q_m[8] is "0". Therefore, the formula of hCnt may well be written as:

$$hCnt(t)=hCnt(t-1)+N_0N_1+q_{13}\_m[8]$$

Subsequently, regarding step S113, the computation can be expressed as:

$$hCnt(t)=hCnt(t-1)+\sim N_0N_1+1$$

Here, when considered similarly to the case of step S112, this computation is executed only for q_m[8]=1, so that it can be written as:

$$hCnt(t)=hCnt(t-1)+\sim N_0N_1+q\_m[8]$$

It is permitted by reducing the equations to compute steps S110 and S113 with quite the same equation and compute steps S111 and S112 with quite the same equation, and the formulas can be simplified into two as indicated below:

$$hCnt(t) = hCnt(t-1) + \begin{pmatrix} N_0N_1 \\ \sim N_0N_1 \end{pmatrix} + q\_m[8]$$

Here, the data $N_0N_1$ is inverted when steps S110 and S113 are executed, and it is not inverted when steps S111 and S112 are executed. Referring to FIG. 9, the data $N_0N_1$ is computed at step S907, and whether or not the data $N_0N_1$ is to be inverted is decided at step S908. In accordance with the result of the decision, the data $N_0N_1$ is not inverted at step S909, and it is inverted at step S910, whereupon the value of hCnt is computed at step S911.

Next, there will be explained a value q_m[9] which has not been explained above and which is used at steps S909 and S910. This value is a value which is directly substituted into q_out[9] finally at steps S913 and S914, so that it is equivalent to q_out[9] which is used at steps S110, S111 and S108 in FIG. 1. When the value q_out[9] is viewed in succession, the value q_out[9] is "0" at step S110. Subsequently, the value q_out[9] is "1" at step S111. At step S108, ~q_m[8] is substituted into the value q_out[9]. Whether step S112 or step S113 is to be executed, is branched depending upon the value of the data q_m[8], and the individual occasions will therefore be checked. At step S112, the value q_m[8] is "0", and hence, the value q_out[9] becomes "1". At step S113, the value q_m[8] is "1", and hence, the value q_out[9] becomes "0". It is accordingly understood that, as in the case of the inversion conditions of the data $N_0N_1$, steps S110 and S113 use the same value of the data q_out[9] and steps S111 and S112 use the same value of the data q_out[9].

Next, q_out[0:9] being a value which is finally output is determined at steps S912–S914 in FIG. 9. Whether the data q_m[9] is "0" or "1", is decided at step S912. In accordance with the decision, the data q_m[0:9] is output as it is, at step S913, and the data q_m[0:7] is inverted and then output at step S914. Difference is whether or not the data q_m[0:7] is inverted. Also in this regard, in FIG. 1, values are determined at three steps S108, S110 and S111 through conditional branches at steps S106 and S107. However, since the value substituted at step S108 depends ultimately upon the data q_m[8] in the same manner as in the case of calculating the value of the data q_m[9], the data q_out [0:9] is determined in accordance with which of steps S112 and S113 is to be executed after the branch at step S109. Whether or not the data q_m[0:7] is inverted, will be checked in succession. The data q_m[0:7] is not inverted at step S110. The data q_m[0:7] is inverted at step S111. At step S112, the data q_m[8] is "0", and hence, the data q_m[0:7] is inverted. At step S113, the data q_m[8] is "1", and hence, the data q_m[0:7] is not inverted. That is, it is understood that, also in determining the data q_out[0:9], steps S110 and S113 may well execute the same processing and steps S111 and S112 may well execute the same processing.

As thus far described, in the present invention, steps S106–S113 in FIG. 1 in the prior art are replaced with steps S907–S914 in FIG. 9.

Figure 14:
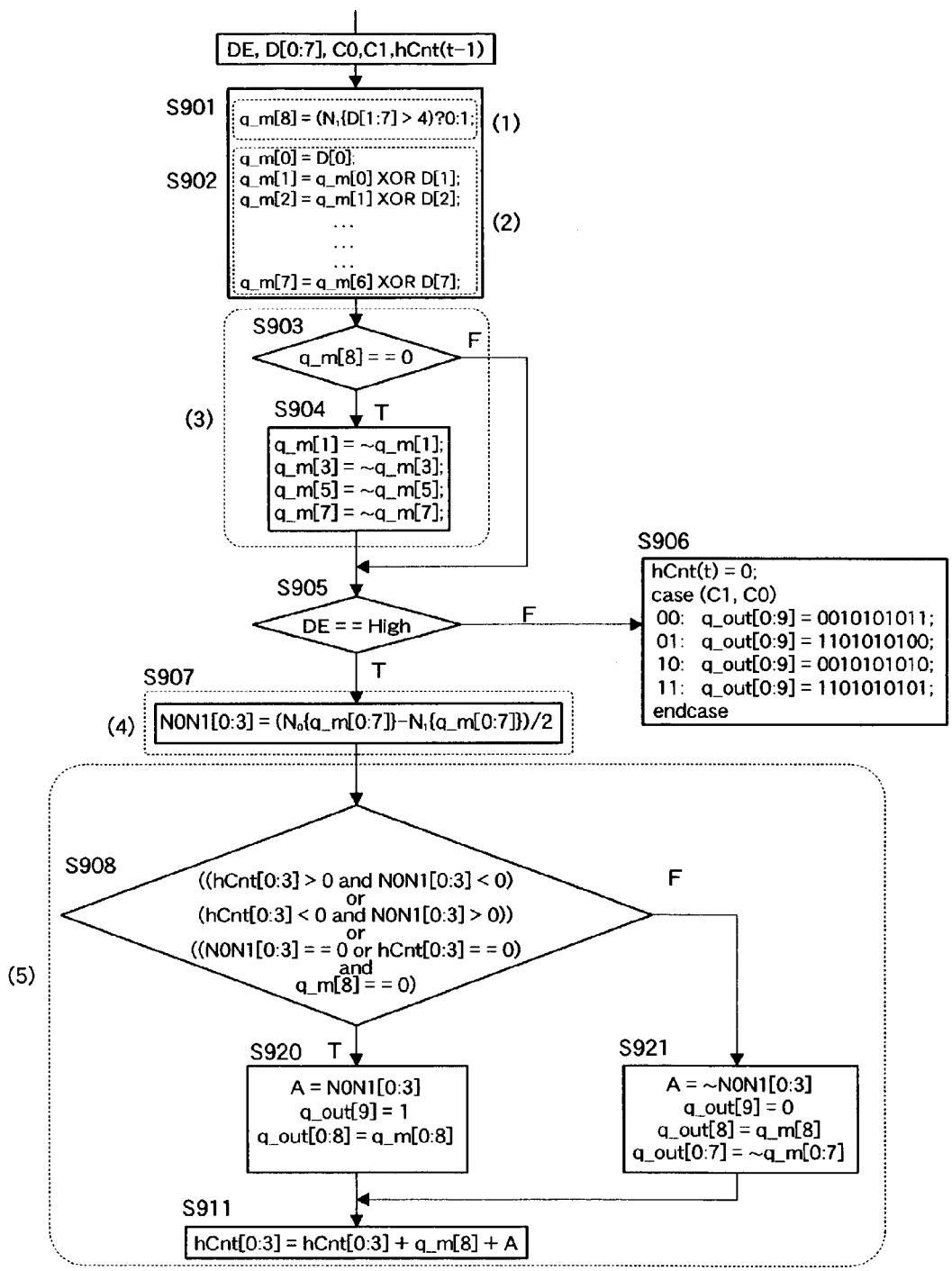
FIG. 14 is a flow chart of the whole-simplified coder in the present invention.

Incidentally, although FIG. 9 is formed in consideration of its correspondence with a block diagram of FIG. 5 to be stated below and therefore includes redundant parts, a flow chart in which only the algorithm is considered can be expressed in a simpler form as shown in FIG. 14.

[Circuit]

Figure 5:
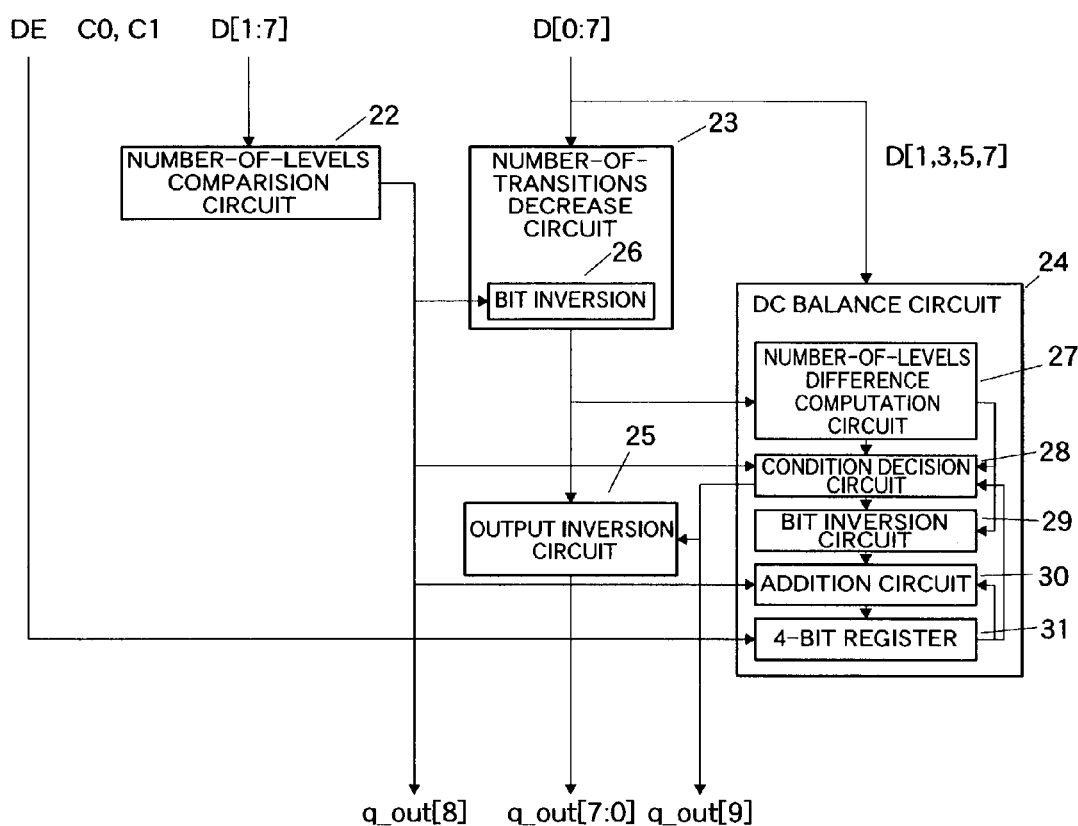
FIG. 5 is a block diagram showing an embodiment of a coding circuit in the present invention.

The block diagram in which the flow chart of FIG. 9 is implemented as a circuit, is shown in FIG. 5.

Now, the flow of the coding circuit in the present invention will be described with reference to FIG. 5.

First, among an 8-bit input signal D[0:7], a signal D[1:7] which corresponds to the 7 bits of the 2nd bit to the 8th bit is applied to a number-of-levels comparison circuit 22. The number-of-levels comparison circuit 22 counts the number of level "H" in the applied 7-bit data and judges whether the number is larger or smaller than "4", so as to deliver a judged output. The output is applied to a number-of-transitions decrease circuit 23 and a DC balance circuit 24, and it is also output as q_out[8]. Separately from the 7-bit signal D[1:7], the 8-bit input signal D[0:7] is applied to the number-of-transitions decrease circuit 23. Data of 8 bits in which the number of the transitions between adjacent two bits is decreased, are output on the basis of a result coded in the number-of-transitions decrease circuit 23 and the output of the number-of-levels comparison circuit 22. The output of the number-of-transitions decrease circuit 23 is applied to an output inversion circuit 25. The output inversion circuit 25 passes all the bits as they are or inverts them, depending upon the output of the DC balance circuit 24, thereby to output q_out[0:7]. Also, the output of the number-of-transitions decrease circuit 23 is applied to the DC balance circuit 24. The DC balance circuit 24 computes the DC balance of the current data by receiving the output of the number-of-transitions decrease circuit 23, bit data D[1], D[3], D[5] and D[7] of odd-numbered suffixes in the input signal D[0:7], and the output of the number-of-levels comparison circuit 22, and it adds the computed DC balance to the DC balance of data having been output in the past and being held in an internal register, thereby to obtain the value of a counter and to hold the value in the register as the next value. Simultaneously, the DC balance circuit 24 supplies the output inversion circuit 25 with the output which indicates whether or not the data to be output at that time is to be inverted. Besides, when a signal DE is at a level "L", the DC balance circuit 24 clears the content of the internal register having 4 bits. Also, when the signal DE is at the level "L", the DC balance circuit 24 needs to output special data which is inserted for synchronization and which is called "Comma". However, since the present invention is directed toward the method of realizing the coding circuit for the "H" level of the signal DE, a circuit for generating the data "Comma" shall be omitted. The coding which conforms to the DVI standard, is implemented in the above way.

The correspondence between the flow chart of FIG. 9 and the block diagram of FIG. 5 is as follows:

| | | |
|---|---|---|
| S901 | : | 22 in FIG. 5 |
| S902 | : | 23 in FIG. 5 |
| S903, S904 | : | 26 in FIG. 5 |
| S907 | : | 27 in FIG. 5 |
| S908 | : | 28 in FIG. 5 |
| S909, S910 | : | 29 in FIG. 5 |
| S911 | : | 30, 31 in FIG. 5 |
| S912–S914 | : | 25 in FIG. 5 |

The operations of various portions in FIG. 5 will be described in more detail.

First, the number-of-levels comparison circuit 22 will be described. It corresponds to the part of the block S901 in the flow chart of FIG. 9.

The number-of-levels comparison circuit 22 is a circuit which counts the number of bits at the "H" level in its input signal and judges if the number is at least 4. In accordance with the DVI specification, the following is stipulated:

$(N_1\{D\}>4)$ OR $(N_1\{D\}==4$ AND $D[0]==0)$

By evaluating the 8-bit input data D[7:0], therefore, the circuit 22 must detect a case where the number of the level "H" is larger than 4, and a case where the number of the level "H" is 4 when bit D[0] is at the level "L". However, this condition can be reduced so as to dispense with the evaluation of the bit D[0], that is, it is equivalent to:

$N_1\{D[1:7]\}>=4$

In other words, if the number of the bits at the "H" level is at least 4 in the input signal of the 7 bits D[1:7] may be judged. Using this equation, the number of bits necessary for the evaluation decreases one bit. Moreover, since the classification of the cases dependent upon the value of the data D[0] need not be performed, a condition judgment circuit is also dispensed with, to bring forth the advantages of a smaller circuit scale and a higher circuit operation speed.

Figure 10:
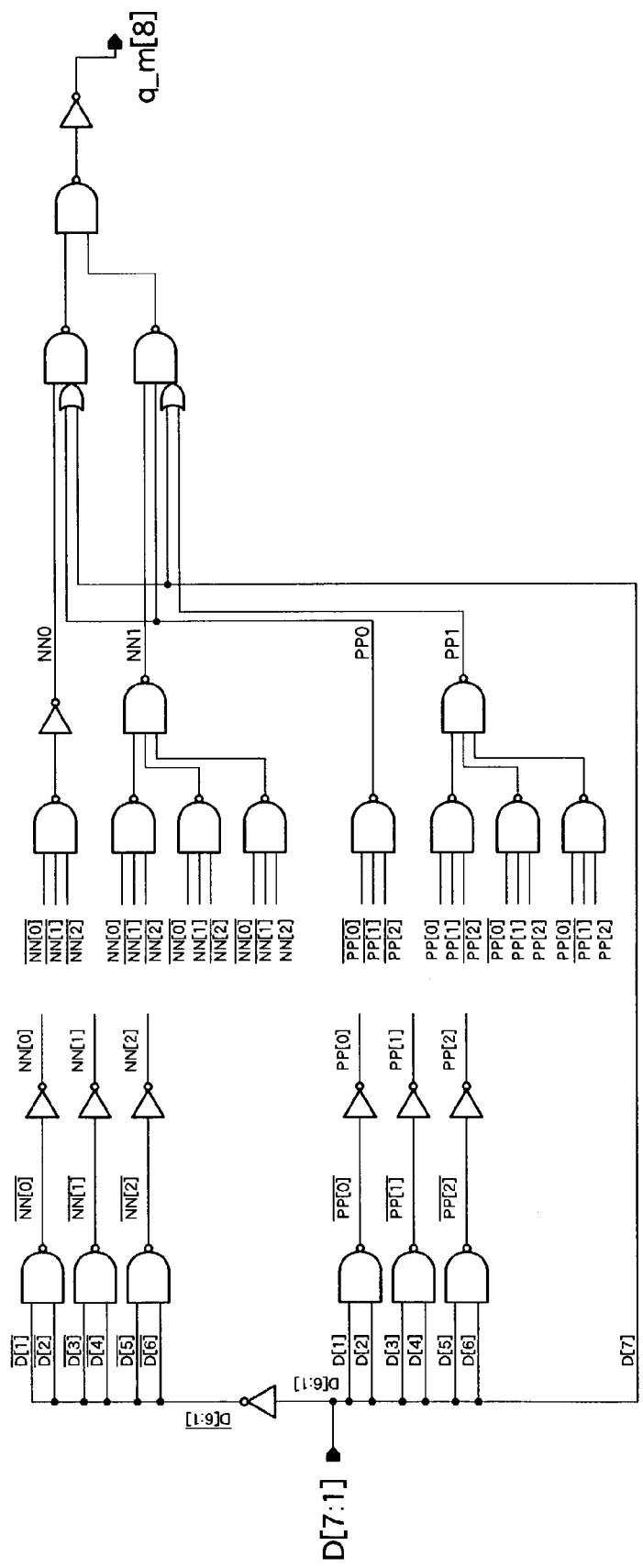
FIG. 10 is a circuit diagram showing an embodiment of the number-of-levels comparison circuit of the coder in the present invention.

The construction of this equation in terms of a practicable circuit is shown in FIG. 10.

As stated before, the circuit is one for deciding whether the number of the bits of "1" in the 7-bit data is larger or smaller than 4. Data D[7:1] being 7 bits of an input is divided into 6 bits of D[6:1] and 1 bit of D[7]. The part of 6 bits is further divided into sets each consisting of 2 bits. The divided data are denoted by D[2i−1] and D[2i] (i=1, 2, 3). Here, putting:

$NN[i] = \overline{D[2i-1]} \cdot \overline{D[2i]}$ $PP[i] = D[2i-1] \cdot D[2i]$ NN[i] becomes "1" when the 2 bits are "00", and PP[i] becomes "1" when the 2 bits are "11". Therefore, a case where both the data NN[i] and PP[i] "0" signifies that the 2 bits are either "01" or "10". Conditions under which at least four "1" exist in the 7 bits of the data D[7:1] are sorted out as follows, depending upon the number of "1" in the data NN[1], NN[2] and NN[3], the number of "1" in the data PP[1], PP[2] and PP[3], and the value "0" or "1" of the data D[7]:

| D[7] | NN[i] == Number of "1" | PP[i] == Number of "1" |
|---|---|---|
| 0 | 0 | 1, 2, 3 |
| 0 | 1 | 2 (, 3) |
| 1 | 0 | 0, 1, 2, 3 |
| 1 | 1 | 1, 2(, 3) |

Conditions within ( ) in the table do not actually occur, but they are added because condition formulas are simplified.

Letting NN0 denote a condition as to whether or not the number in which NN[i]=="1" holds is zero, it can be checked by the following equation:

$NN0 = \overline{NN[0]} \cdot \overline{NN[1]} \cdot \overline{NN[2]}$

Letting NN1 denote a condition as to whether or not the number in which NN[i]=="1" holds is one, it can be checked by the following equation:

$NN1 = (NN[0] \cdot \overline{NN[1]} \cdot \overline{NN[2]}) + (\overline{NN[0]} \cdot NN[1] \cdot \overline{NN[2]}) + (\overline{NN[0]} \cdot \overline{NN[1]} \cdot NN[2])$ Letting PP0_ denote a condition as to whether or not the number in which PP[i]=="1" holds is any other than zero, it can be checked by the following equation:

$PP0\_ = \overline{\overline{PP[0]} \cdot \overline{PP[1]} \cdot \overline{PP[2]}}$ Letting PP2 denote a condition as to whether or not the number in which PP[i]=="1" holds is 2, it can be checked by the following equation:

$PP2 = (PP[0] \cdot PP[1] \cdot \overline{PP[2]}) + (\overline{PP[0]} \cdot PP[1] \cdot PP[2]) + (PP[0] \cdot \overline{PP[1]} \cdot PP[2])$ Using these condition formulas, let's rearrange the formula of the condition under which "1" exist at least 4 in the data D[7:1] of 7 bits. Then, the condition formula can be expressed as follows:

$\{(D[7]+PP0\_) \cdot NN0\} + \{(D[7]+PP2) \cdot PP0\_ \cdot NN1\}$

This formula can be calculated with a delay of 5 stages of gates ideally. However, inverters inserted as buffers exist in the number of 14, and they correspond to 28 transistors. With these transistors added, 130 transistors are included in the circuit as shown in FIG. 10, and the length of a critical path corresponds to 8 stages of gates. A similar circuit can be constructed of bit slice adders employing full adders. In this case, in a simple computation, the number of transistors is 112, and the length of a critical path corresponds to 8 stages of gates ideally. Buffers etc., however, might be inserted midway in actually implementing the circuit as an integrated circuit. Therefore, a circuit of less gate delay can be realized in an equivalent circuit scale by employing the circuit of the present invention.

Next, there will be described the number-of-transitions decrease circuit 23 (including a bit inversion portion 26) in FIG. 5. It corresponds to the part of steps S902–S904 in the flow chart of FIG. 9.

The number-of-transitions decrease circuit 23 has realized a circuit which calculates step S102.

Figure 3:
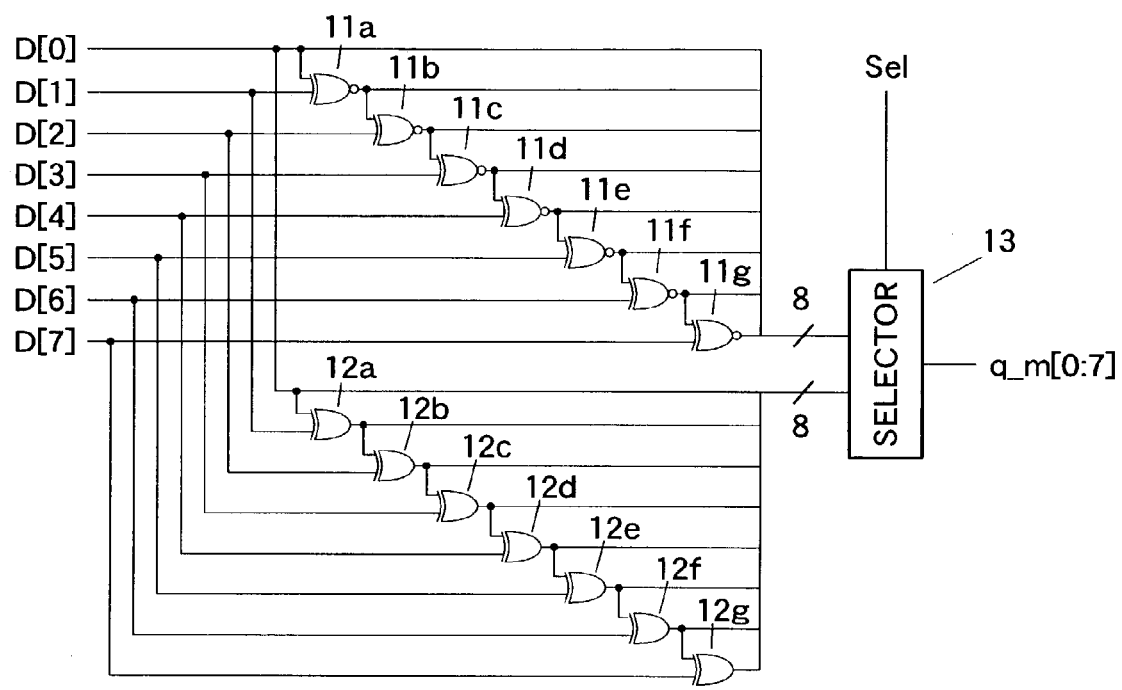
FIG. 3 shows a DVI-standard number-of-transitions decrease circuit in the prior art.
Figure 6:
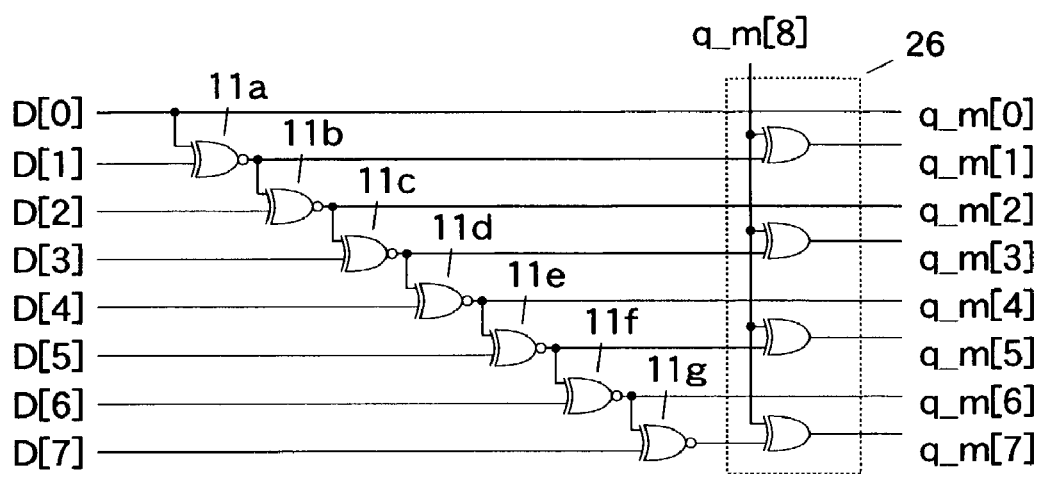
FIG. 6 is a circuit diagram showing an embodiment of a number-of-transitions decrease circuit in the present invention.
Figure 7:
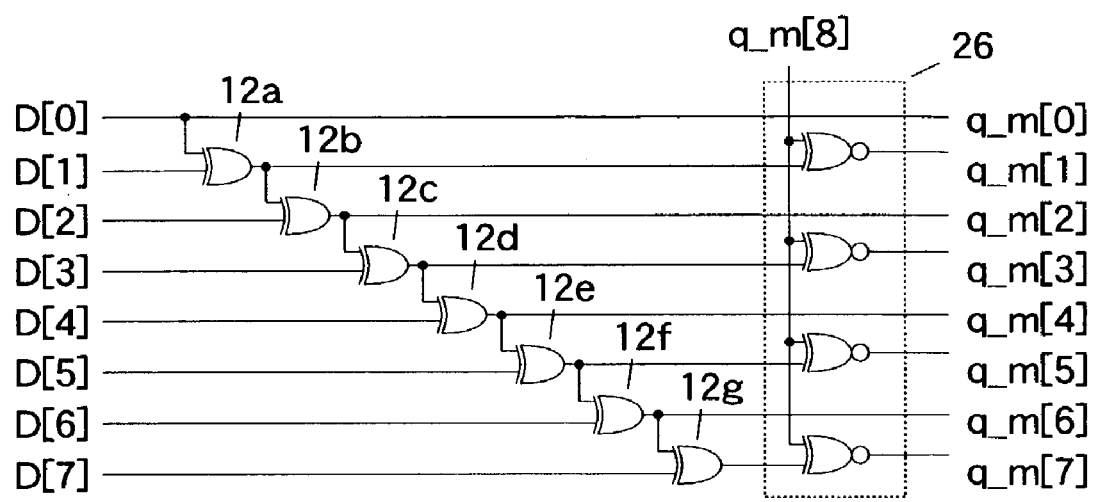
FIG. 7 is a circuit diagram showing an embodiment of a number-of-transitions decrease circuit in the present invention.

More specifically, the number-of-transitions decrease circuit 23 can be realized in the following form. As shown in FIG. 6, the output of the number-of-levels comparison circuit 22 being delivered as the data q_m[8] is subjected to coding based on XNORs 11a–11g and is thereafter passed through the bit inversion circuit 26 (steps S903 and S904 in FIG. 9) which inverts bits of odd-numbered suffixes. Likewise, it can also be realized in the second embodiment of the number-of-transitions decrease circuit in the present invention as shown in FIG. 7, the output of the circuit 12 is subjected to coding based on XORs 12a–12g and is thereafter passed through the bit inversion circuit 26 which inverts bits of odd-numbered suffixes. As compared with the number-of-transitions decrease circuit as shown in FIG. 3, the circuit in FIG. 6 or FIG. 7 can curtail either seven XNORs 11a–11g or seven XORs 12a–12g. Moreover, since the selector 13 in FIG. 3 is replaced with the circuit 26 which inverts the bits of odd-numbered suffixes, the number of required transistors becomes a half in case of a CMOS circuit. Consequently, the number of transistors constituting the circuit becomes roughly a half. Simultaneously, power consumption is permitted to lower by employing the circuit of the present invention.

Figure 11:
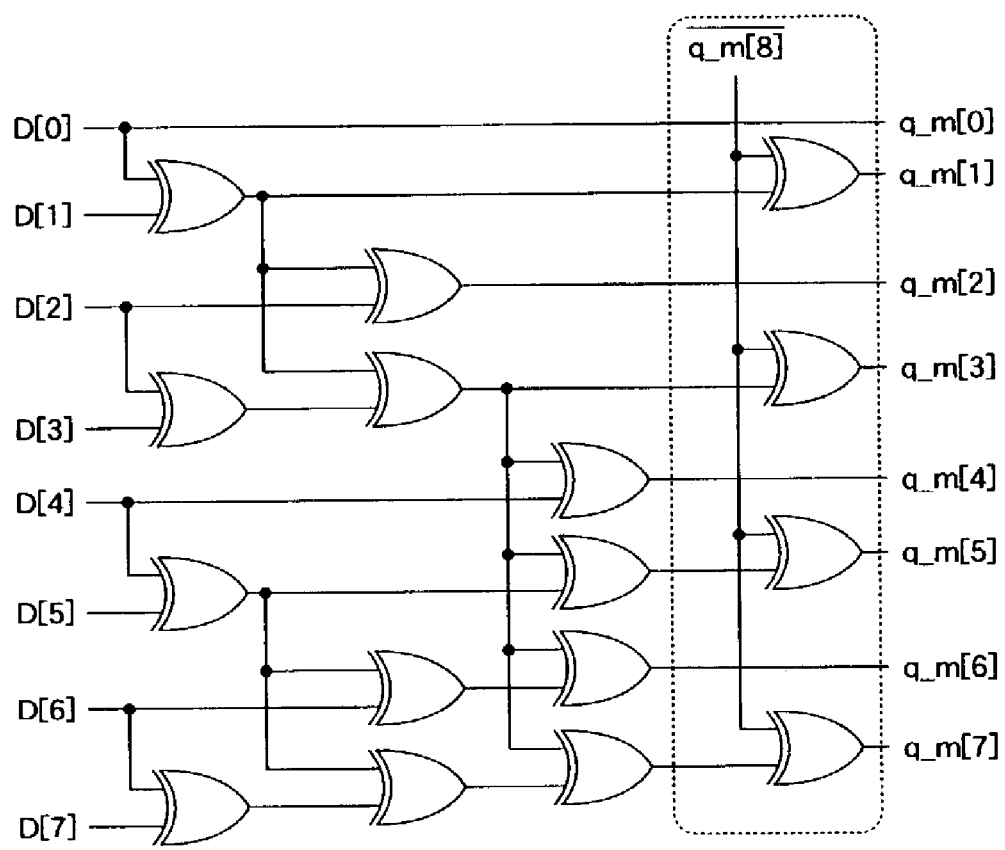
FIG. 11 is a circuit diagram showing an embodiment of a number-of-transitions decrease circuit in the present invention.

Besides, the number-of-transitions decrease circuit 23 can be realized as a more efficient circuit as shown in FIG. 11.

A portion which is not enclosed with a broken line in FIG. 11 (a portion outside the bit inversion circuit 26) is a circuit which incarnates step S902 in FIG. 9.

When computed in conformity with the DVI standard (step S102 in FIG. 1), the corresponding part becomes:

$q\_m[0]=D[0]$ $q\_m[1]=D[1]\oplus q\_m[0]$ $q\_m[2]=D[2]\oplus q\_m[1]$ $q\_m[3]=D[3]\oplus q\_m[2]$ $q\_m[4]=D[4]\oplus q\_m[3]$ $q\_m[5]=D[5]\oplus q\_m[4]$ $q\_m[6]=D[6]\oplus q\_m[5]$ $q\_m[7]=D[7]\oplus q\_m[6]$ In order to obtain data q_m[7], a long time is expended because data q_m[0] to q_m[6] must be calculated in succession. Therefore, the computation is performed as follows:

$q\_m[0]=D[0]$ $q\_m[1]=D[1]\oplus q\_m[0]$ $q\_m[2]=D[2]\oplus q\_m[1]$ $q\_m[3]=D[3]\oplus q\_m[2]$ $q\_m[4]=D[4]\oplus q\_m[3]$ $q\_m[5]=(D[5]\oplus D[4])\oplus q\_m[3]$ $q\_m[6]=(D[6]\oplus(D[5]\oplus D[4]))\oplus q\_m[3]$ $q\_m[7]=(D[7]\oplus(D[6]\oplus(D[5]\oplus D[4])))\oplus q\_m[3]$ In this manner, regarding the data q_m[5]–q_m[7], terms in parentheses are calculated in parallel earlier so that the XOR of the calculated result and the data q_m[3] is taken, whereby the result of the computation can be obtained faster. Even with this contrivance, however, 3 stages of XOR gates must be passed before the obtainment of the data q_m[3]. Therefore, the computation is further deserialized as follows:

$q\_m[0]=D[0]$ $q\_m[1]=D[1]D[0]$ $q\_m[2]=D[2]\oplus q\_m[1]$ $q\_m[3]=(D[3]\oplus D[2])\oplus q\_m[1]$ $q\_m[4]=D[4]\oplus q\_m[3]$ $q\_m[5]=(D[5]\oplus D[4])\oplus q\_m[3]$ $q\_m[6]=(D[6]\oplus(D[5]\oplus D[4]))\oplus q\_m[3]$ $q\_m[7]=((D[7]\oplus D[6])\oplus(D[5]\oplus D[4]))\oplus q\_[3]$ Thus, the result can be obtained merely by passing through 2 stages of XOR gates, or 3 stages of XOR gates even in case of requiring the longest time, until the obtainment of the data q_m[3]. With the circuit in FIG. 11, although the number of gates increases, the result which can be obtained by passing through the 7 stages of XOR gates in the preceding embodiment can be obtained by the 3 stages, so that the output can be produced in a shorter delay time.

It is the same as in the case of FIG. 6 or FIG. 7 that the portion enclosed with the broken line in FIG. 11 is the bit inversion circuit 26 and corresponds to the part expressed by steps S903 and S904 of the flow chart in FIG. 9. This portion inverts the odd-numbered bits in accordance with the value of the data q_m[8].

Besides, likewise to the relationship between FIG. 6 and FIG. 7, a circuit having the same function can be realized by employing XNORs, not the XORs.

Next, the DC balance circuit 24 will be described.

The DC balance circuit 24 is a circuit which judges which of the number of the level "H" and that of the level "L" is larger in the 8 bits of the output of the number-of-transitions decrease circuit 23, by including the internal register, and which determines whether or not the final output is to be inverted, so as to keep balance DC-wise in a plurality of T.M.D.S. characters.

The DC balance circuit 24 includes a number-of-levels difference computation circuit 27 which computes the half of the difference between the number of the "H" bits and that of the "L" bits in the 8-bit data, a bit inversion circuit 29 which inverts input 4 bits in accordance with a condition, a 4-bit full addition circuit 30 with a carry input, a condition decision circuit 28 which computes the condition, and the 4-bit register 31 which stores a past DC balance status.

According to the prior-art system, there are the four sorts of formulas for computing the counts of the counters, and hence, it is required to pass the two judgments; the judgment on which of $(N_0-N_1)$ and $(N_1-N_0)$ is selected as a value to be added to the count Cnt(t−1) of the internal counter, and the judgment on whether or not the data q_m[8] is added. In contrast, according to the system of the present invention, the two sorts of formulas for computing the counts of the counters suffice, and hence, the condition decision circuit 28 may judge only one condition as to whether or not the data $N_0N_1$ is to be inverted.

Figure 4:
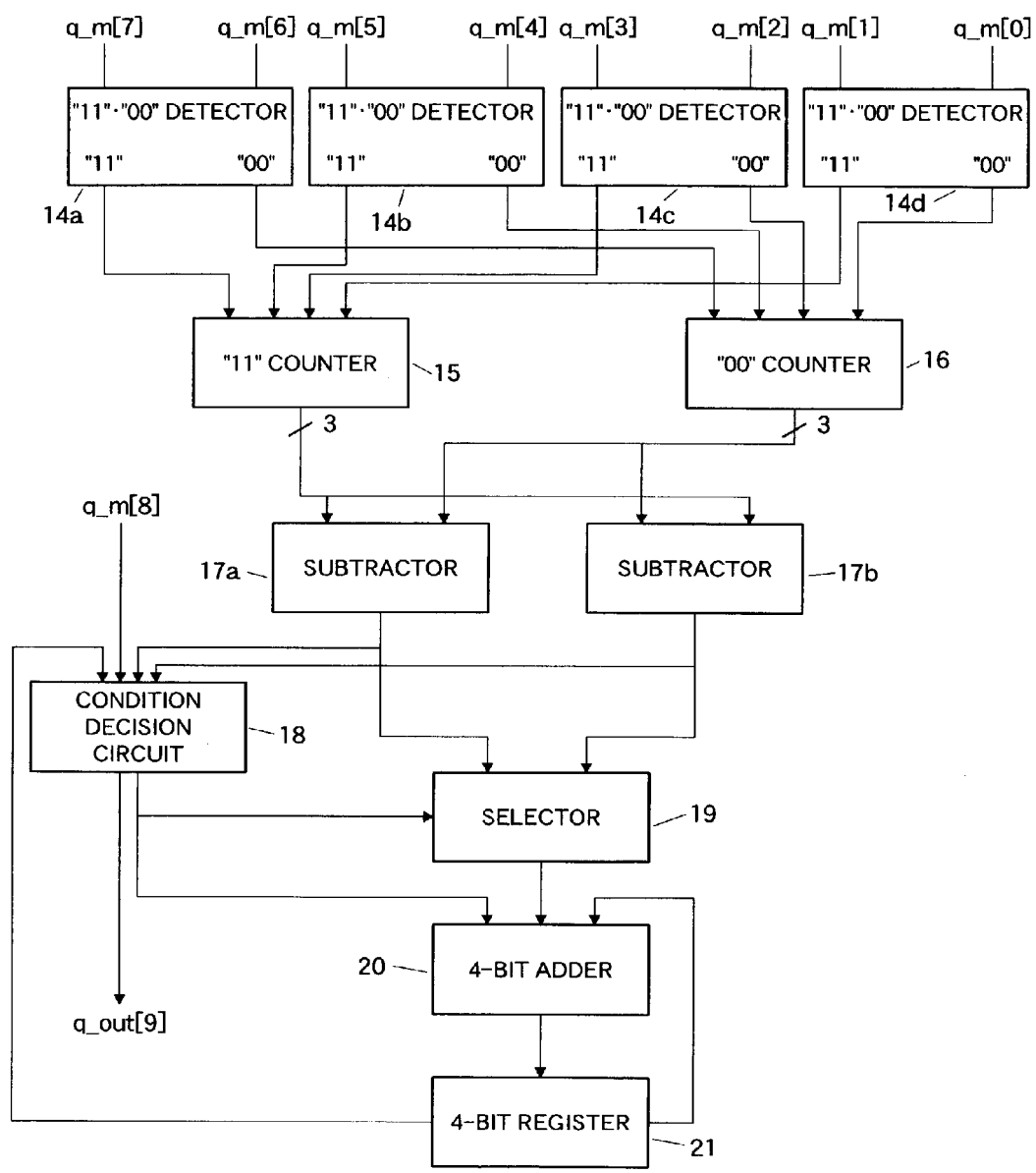
FIG. 4 shows a DVI-standard DC balance circuit in the prior art.

Besides, according to the prior-art system, the two subtraction circuits for $N_0N_1$ and $N_1N_0$ as shown at 17a and 17b in FIG. 4 are required, whereas according to the system of the present invention, the number-of-levels difference computation circuit 27 may include one subtraction circuit, by employing the bit inversion circuit in FIG. 5 instead of the selector 19, so that a hardware size decreases. As compared with the prior-art circuit arrangement shown in FIG. 4, therefore, the circuit arrangement of the present invention simplifies the condition decision circuit 28 and the number-of-levels difference computation circuit 27, and it is permitted to decrease a hardware size and also lower power consumption.

Next, the number-of-levels difference computation circuit 27 (step S907 in the flowchart of FIG. 9) constituting the DC balance circuit 24 will be stated in more detail.

The number-of-levels difference computation circuit 27 is a circuit which receives the output of the number-of-transitions decrease circuit 23 so as to compute the half (expressed as $N_0N_1$) of the difference between the number of the "L" bits and that of the "H" bits. Here, the following relationship holds:

$$(N_0\{q\_m[0:7]\}-N_1\{q\_m[0:7]\})/2=4-N_1\{q\_m[0:7]\}=N_0\{q\_m[0:7]\}-4$$

It is therefore understood that, if $N_1\{q\_m[0:7]\}$ is odd, $N_0N_1$ is also odd, while if $N_1\{q\_m[0:7]\}$ is even, $N_0N_1$ is also even. In a case where the data $N_0N_1$ is expressed by a binary number, whether it is even or odd is equivalent to whether the least significant bit thereof is at the level "L" or the level "H". Accordingly, the least significant bit of the data $N_0N_1$ can be obtained by judging whether the data $N_1\{q\_m[0:7]\}$ is even or odd. Whether the sum of the data $q\_m[0]$ to $q\_m[7]$ of 8 bits is even or odd, can be found in accordance with Formula "a" below.

$$q\_m[0] \oplus q\_m[1] \oplus q\_m[2] \oplus q\_m[3] \oplus q\_m[4] \oplus q\_m[5] \oplus q\_m[6] \oplus q\_m[7] \quad \text{[Formula a]}$$

The relationship of Formula "b" below is held by utilizing the definition of $q\_m[n]$, and the fact that the XOR between the same data becomes the level "L".

$$q\_m[n-1] \oplus q\_m[n] = q\_m[n-1] \oplus q\_m[n-1] \oplus D[n]) = D[n] \quad \text{[Formula b]}$$

When Formula "a" is reduced using Formula "b", Formula "c" below is obtained.

$$D[1] \oplus D[3] \oplus D[5] \oplus D[7] \quad \text{[Formula c]}$$

Figure 8:
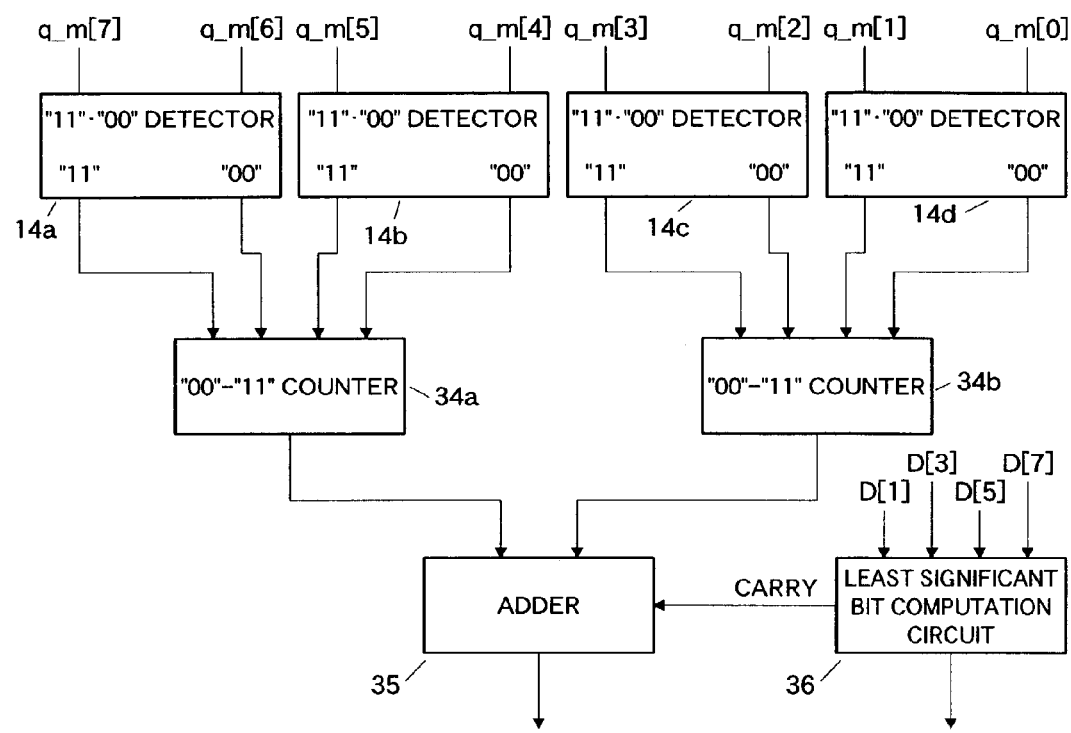
FIG. 8 is a block diagram showing an embodiment of a number-of-levels difference computation circuit in a DC balance circuit in the present invention.

As seen from these operations, the least significant bit of the data $N_0N_1$ can be computed with the 4 bits of D[1], D[3], D[5] and D[7]. Therefore, the least significant bit of the data $N_0N_1$ can be calculated without passing the data through the number-of-transitions decrease circuit 23, and it can be obtained faster in correspondence with the delay time of the number-of-transitions decrease circuit 23. FIG. 8 shows an embodiment of the number-of-levels difference computation circuit in the present invention. Upon receiving the output $q\_m[0]$ to $q\_m[7]$ of the number-of-transitions decrease circuit 23, circuits 14a–14d detect whether their input 2 bits are "11" or "00". Upon receiving the outputs of the corresponding circuits 14a–14d, a circuit 34a or 34b computes "00"–"11" which indicates the difference between the number of "00" and that of "11" corresponding to the 4 bits of the data $q\_m[0]$ to $q\_m[3]$ or the data $q\_m[4]$ to $q\_m[7]$. Since the difference "00"–"11" is equal to ("0"–"1")/2 indicating the half of the difference between the number of "0" and that of "1", the data $N_0N_1$ can be calculated by adding the outputs of the circuits 34a and 34b by means of an adder 35. Usually, an adder circuit computes from a least significant bit in succession, and hence, a long time is required till the obtainment of a most significant bit. In the system of the present invention, however, the least significant bit can be computed beforehand by preparing a least significant bit computation circuit 36, and hence, the computation can be performed fast. Moreover, since the least significant bit can be computed with the small number of input signals of the 4 bits of D[1], D[3], D[5] and D[7], a hardware size does not increase.

Figure 12:
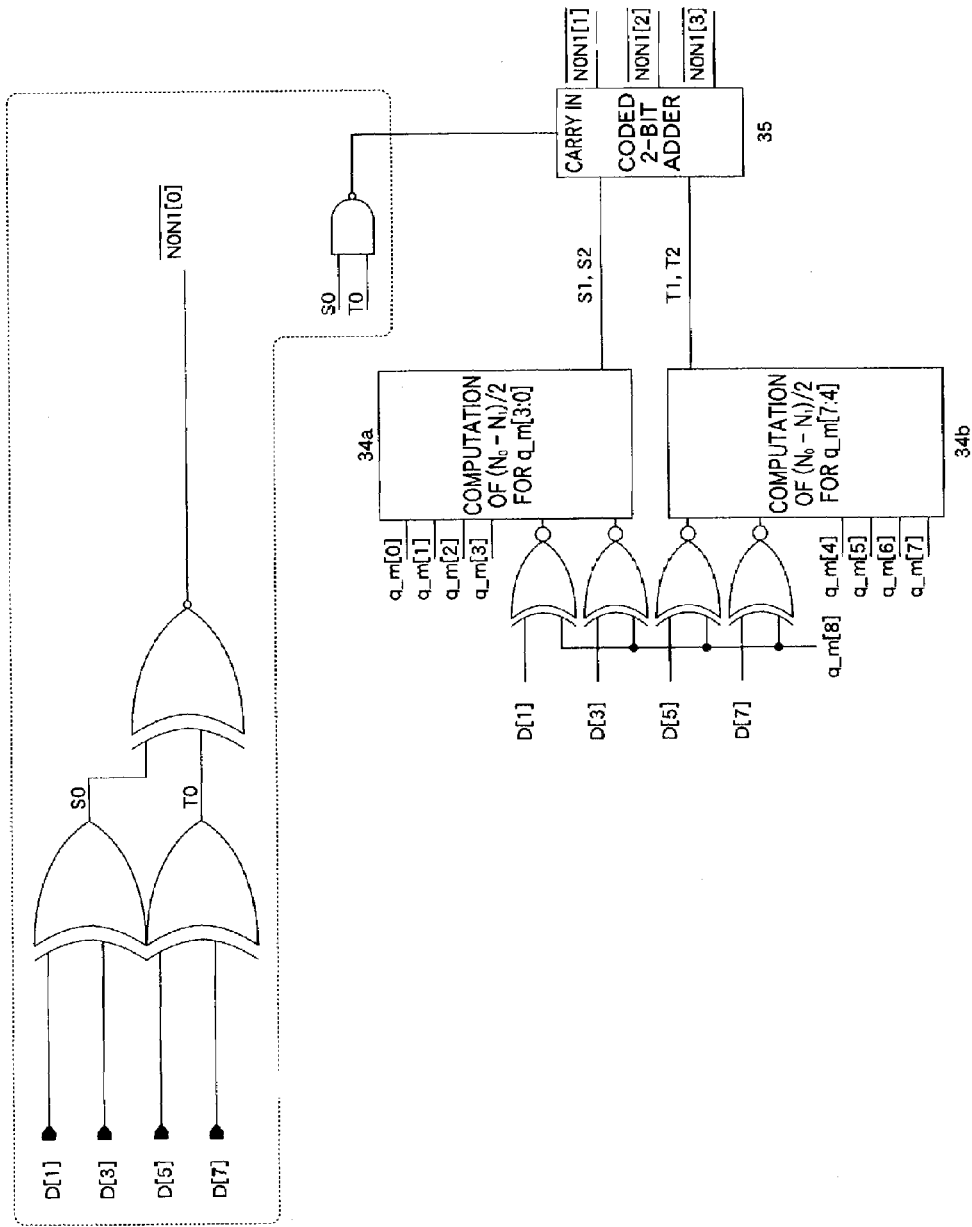
FIG. 12 is a circuit diagram showing an embodiment of a number-of-levels difference computation circuit in a DC balance circuit in the present invention.

Further, a more practicable circuit arrangement of the embodiment in FIG. 8 is shown in FIG. 12.

The half of the difference between the number ($N_0$) of the bits of "0" and the number ($N_1$) of the bits of "1" is calculated from the data $q\_m[0]$ to $q\_m[7]$. To this end, there are first calculated the half of the difference between the number of the bits of "0" and that of the bits of "1" as to the data $q\_m[0]$ to $q\_m[3]$, and the half of the difference between the number of the bits of "0" and that of the bits of "1" as to the data $q\_m[4]$ to $q\_m[7]$. The 3-bit data thus obtained are added up, thereby to calculate the half of the difference between the number of the bits of "0" and that of the bits of "1" as to the data $q\_m[0]$ to $q\_m[7]$. On this occasion, the least significant bit is obtained beforehand by a least significant bit computation circuit 36 enclosed with a broken line in the figure, and the output result of a number-of-transitions decrease portion need not be employed. Therefore, a result is calculated faster than in case of starting the calculation after the obtainment of the result of the number-of-transitions decrease circuit 23.

The algorithm will be described in somewhat more detail.

The differences between the numbers of "0" and "1" as to the data $q\_m[0:3]$ are expressed by 3-bit data S0, S1, S2 of –2 to 2.

| Status | Output code (S2 S1 S0) | Input pattern |
| --- | --- | --- |
| 2 | 010 | 0000 |
| 1 | 001 | 0001 0010 |
|  |  | 0100 1000 |
| 0 | 000 | 1100 0110 |
|  |  | 0011 0101 |
|  |  | 1010 |
| –1 | 111 | 1110 1101 |
|  |  | 1011 0111 |
| –2 | 110 | 1111 |

Logical expressions created for the respective data S0, S1 and S2 are as follows:

$$S0 = q\_m[0] \oplus q\_m[1] \oplus q\_m[2] \oplus q\_m[3]$$

$$S1 = S2 + \overline{q\_m[0]} \cdot \overline{q\_m[1]} \cdot \overline{q\_m[2]} \cdot \overline{q\_m[3]}$$

$$S2 = q\_m[0] \cdot q\_m[1] \cdot q\_m[2] \cdot q\_m[3] + q\_m[0] \cdot q\_m[1] \cdot (q\_m[2] \oplus q\_m[3]) + (q\_m[0] \oplus q\_m[1]) \cdot q\_m[2] \cdot q\_m[3]$$

Here, using the following condition:

$$q\_m[n] \oplus q\_m[n+1] = D[n+1](N_1\{D[7:1]\} < 4) = \overline{D[n+1]}(N_1\{D[7:1]\} \geq 4)$$

The above expressions are simplified as follows:

$$S0 = D[1] \oplus D[3]$$

$$S1 = S2 + \overline{q\_m[0]} \cdot q\_m[1] \cdot \overline{q\_m[2]} \cdot q\_m[3]$$

$$S2 = q\_m[0] \cdot q\_m[1] \cdot q\_m[2] + q\_m[0] \cdot q\_m[1] \cdot D[3]$$
$$(\text{or}\overline{D[3]}) + D[1](\text{or}\overline{D[1]}) \cdot q\_m[2] \cdot q\_m[3]$$

When considered similarly, the data q_m[4:7] is expressed by the values of the 3 bits of T0, T1 and T2:

$$T0 = D[5] \oplus D[7]$$

$$T1 = T2 + \overline{q\_m[4]} \cdot q\_m[5] \cdot \overline{q\_m[6]} \cdot q\_m[7]$$

$$T2 = q\_m[4] \cdot q\_m[5] \cdot q\_m[6] + q\_m[4] \cdot q\_m[5] \cdot D[7]$$
$$(\text{or}\overline{D[7]}) + D[5](\text{or}\overline{D[5]}) \cdot q\_m[6] \cdot q\_m[7]$$

The data $(N_0-N_1)/2$ is calculated by adding up the values S0 to S2 and T0 to T2.

Next, there will be described a counter updating portion which is included in the DC balance circuit 24. The counter updating portion includes circuits 28–31 in FIG. 5. It is expressed by steps S908–S911 in the flow chart of FIG. 9.

Figure 13:
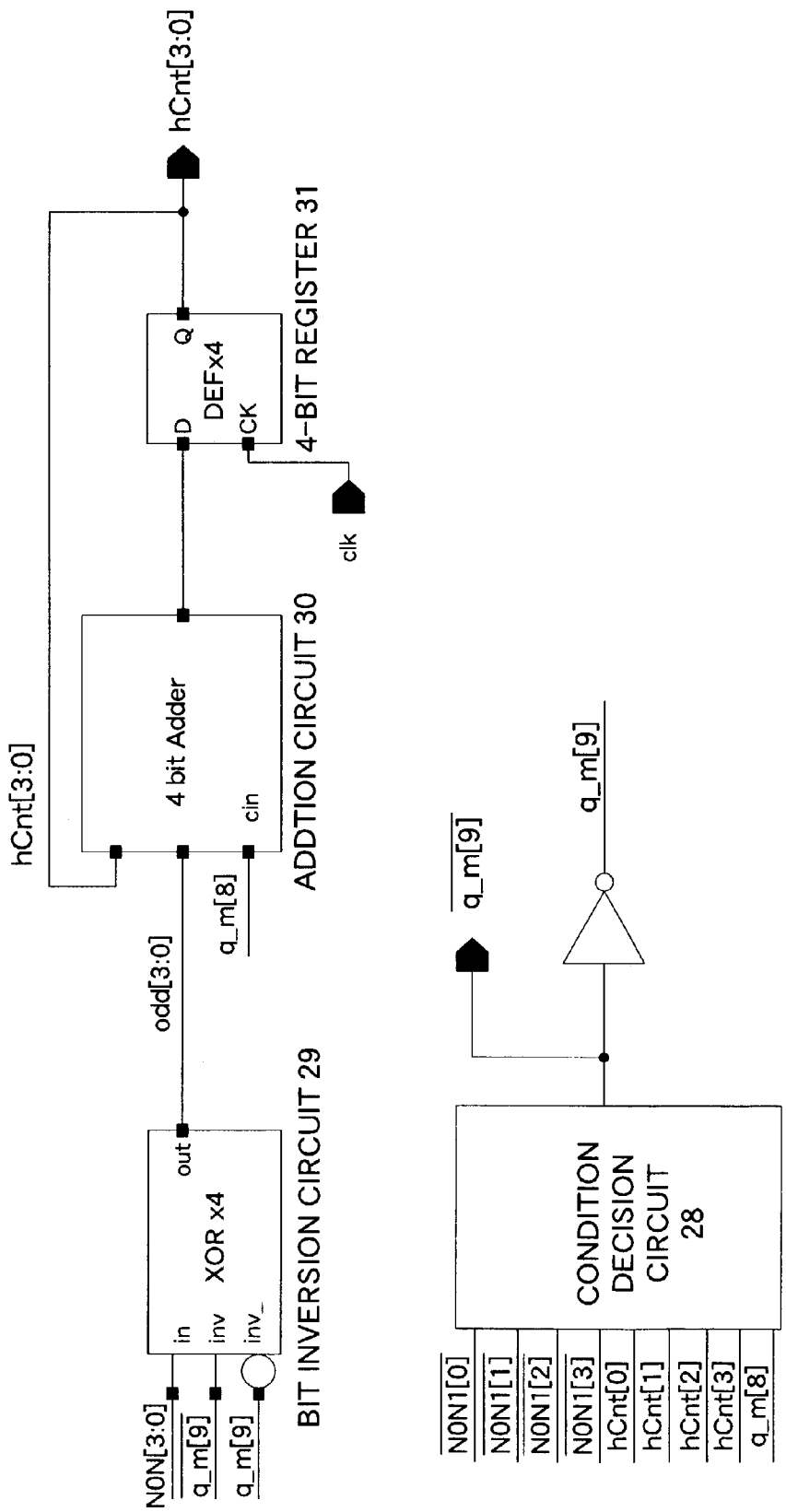
FIG. 13 is a circuit diagram showing an embodiment of a counter updating portion in the present invention.

A practicable circuit diagram of the circuits 28–31 constituting the counter updating portion is shown in FIG. 13. As explained in the section of the description of the flow chart, the overlapping processes are simplified. Therefore, the counter updating portion merely has the simple construction that the bit inversion circuit 29 inverts the bits of the data $N_0N_1$ by receiving the output of the condition decision circuit 28, and that the result of the inversion, the output of the 4-bit register 31 and the data q_m[8] are added up by the addition circuit 30. Accordingly, in the circuit arrangement of the present invention, a hardware size is smaller and power consumption is lower than those in the prior-art circuit arrangement.

IDUSTRIAL APPLICABILITY

This invention can be applied to a coding circuit for transmitting a digital image signal at high speed.

The invention claimed is:

1. A semiconductor integrated circuit for coding input data of 8 bits into output data of 10 bits, said semiconductor integrated circuit comprising:
    a number-of-levels comparison circuit for comparing a number of bits having a first level and a number of bits having a second level in predetermined bits of the input data to output first data which changes in accordance with whether or not at least 4 bits within predetermined 7 bits of the input data have the first level and which constitutes a portion of the output data;
    a number-of-transitions decrease circuit for decreasing a number of transitions between adjacent two bits of the input data in accordance with the first data to output second data of 8 bits;
    a DC balance circuit for keeping balance between a number of bits having the first level and a number of bits having the second level in the output data of 10 bits in accordance with the first and second data to output third data which constitutes another portion of the output data; and
    an output inversion circuit for inverting the second data in accordance with the third data to output fourth data which constitutes the other portion of the output data.

2. A semiconductor integrated circuit according to claim 1, wherein said number-of-transitions decrease circuit includes a bit inversion circuit for inverting predetermined 4 bits within the coded input data of 8 bits in accordance with the first data output from said number-of-levels comparison circuit.

3. A semiconductor integrated circuit according to claim 2, wherein the number of stages of XOR gates and/or the number of stages of XNOR gates to be connected in series arc at most three.

4. A semiconductor integrated circuit according to claim 1, wherein said DC balance circuit includes:
    a register for storing history of a half of a difference between a number of bits having the first level and a number of bits having the second level in the output data, to an amount of 4 bits;
    a number-of-levels difference computation circuit for computing a half of a difference between a number of bits having the first level and a number of bits having the second level in the second data output from said number-of-transitions decrease circuit;
    a condition decision circuit for receiving the first data output from said number-of-levels comparison circuit, data output from said register and data output from said number-of-levels difference computation circuit to generate condition data;
    a bit inversion circuit for inverting the data output from said number-of-levels difference computation circuit in accordance with the condition data; and
    an addition circuit for computing a sum of the first data output from said number-of-levels comparison circuit, the data output from said register and data output from said bit inversion circuit to output the computed sum to said register.

5. A semiconductor integrated circuit according to claim 1, wherein said DC balance circuit includes a number-of-levels difference computation circuit for computing a half of a difference between a number of bits having the first level and a number of bits having the second level in the second data output from said number-of-transitions decrease circuit, and said number-of-levels difference computation circuit receives predetermined 4 bits within the input data of 8 bits in addition to the second data.

6. A semiconductor integrated circuit according to claim 1, wherein said number-of-transitions decrease circuit includes:
    a first circuit for decreasing the number of transitions between adjacent two bits of the input data in a case where the number of bits having the first level is larger than a predetermined value;
    a second circuit for decreasing the number of transitions between adjacent two bits of the input data in a case where the number of bits having the second level is larger than a predetermined value; and
    a selector for selecting one of data output from said first circuit and data output from said second circuit in accordance with the first data output from said number-of-levels comparison circuit;
    wherein said first and/or second circuits perform parallel processing, thereby to decrease a number of stages of XOR gates and/or a number of stages of XNOR gates to be connected in series.

7. A semiconductor integrated circuit according to claim 1, wherein said number-of-transitions decrease circuit includes:
    one of a first circuit for decreasing the number of transitions between adjacent two bits of the input data in a case where the number of bits having the first level is larger than a predetermined value and a second circuit for decreasing the number of transitions between adjacent two bits of the input data in a case where the number of bits having the second level is larger than a predetermined value; and a bit inversion circuit for inverting predetermined 4 bits within 8 bits of data output from said one of first and second circuits in accordance with the first data output from said number-of-levels comparison circuit;

wherein said one of first and second circuits performs parallel processing, thereby to decrease one of a number of stages of XOR gates and a number of stages of XNOR gates to be connected in series.

8. A semiconductor integrated circuit for coding input data of 8 bits into output data of 10 bits, said semiconductor integrated circuit comprising:

a number-of-levels comparison circuit for comparing a number of bits having a first level and a number of bits having a second level in predetermined bits of the input data to output first data which constitutes a portion of the output data;

a number-of-transitions decrease circuit for decreasing a number of transitions between adjacent two bits of the input data in accordance with the first data to output second data of 8 bits, said number-of-transitions decrease circuit including a bit inversion circuit for inverting predetermined 4 bits within the coded input data of 8 bits in accordance with the first data;

a DC balance circuit for keeping balance between a number of bits having the first level and a number of bits having the second level in the output data of 10 bits in accordance with the first and second data to output third data which constitutes another portion of the output data; and an output inversion circuit for inverting the second data in accordance with the third data to output fourth data which constitutes the other portion of the output data.

9. A semiconductor integrated circuit according to claim 8, wherein said DC balance circuit includes:

a register for storing history of a half of a difference between a number of bits having the first level and a number of bits having the second level in the output data, to an amount of 4 bits;

a number-of-levels difference computaion circuit for computing a half of a difference between a number of bits having the first level and a number of bits having the second level in the second data output from said number-of-transitions decrease circuit;

a condition decision circuit for receiving the first data output from said number-of-levels comparison circuit, data output from said register and data output from said number-of-levels difference computation circuit to generate condition data;

a bit inversion circuit for inverting the data output from said number-of-levels difference computation circuit in accordance with the condition data; and an addition circuit for computing a sum of the first data output from said number-of-levels comparison circuit, the data output from said register and data output from said bit inversion circuit to output the computed sum to said register.

10. A semiconductor integrated circuit according to claim 8, wherein said DC balance circuit includes a number-of-levels difference computation circuit for computing a half of a difference between a number of bits having the first level and a number of bits having the second level in the second data output from said number-of-transitions decrease circuit, and said number-of-levels difference computation circuit receives predetermined 4 bits within the input data of 8 bits in addition to the second data.

11. A semiconductor integrated circuit according to claim 8, wherein said number-of-transitions decrease circuit includes:

a first circuit for decreasing the number of transitions between adjacent two bits of the input data in a case where the number of bits having the first level is larger than a predetermined value;

a second circuit for decreasing the number of transitions between adjacent two bits of the input data in a case where the number of bits having the second level is larger than a predetermined value; and a selector for selecting one of data output from said first circuit and data output from said second circuit in accordance with the first data output from said number-of-levels comparison circuit;

wherein said first and/or second circuits perform parallel processing, thereby to decrease a number of stages of XOR gates and/or a number of stages of XNOR gates to be connected in series.

12. A semiconductor integrated circuit according to claim 8, wherein said number-of-transitions decrease circuit includes:

one of a first circuit for decreasing the number of transitions between adjacent two bits of the input data in a case where the number of bits having the first level is larger than a predetermined value arid a second circuit for decreasing the number of transitions between adjacent two bits of the input data in a case where the number of bits having the second level is larger than a predetermined value; and a bit inversion circuit for inverting predetermined 4 bits within 8 bits of data output from said one of first and second circuits in accordance with the first data output from said number-of-levels comparison circuit;

wherein said one of first and second circuits performs parallel processing, thereby to decrease one of a number of stages of XOR gates and a number of stages of XNOR gates to be connected in series.

13. A semiconductor integrated circuit for coding input data of 8 bits into output data of 10 bits, said semiconductor integrated circuit comprising:

a number-of-levels comparison circuit for comparing a number of bits having a first level and a number of bits having a second level in predetermined bits of the input data to output first data which constitutes a portion of the output data;

a number-of-transitions decrease circuit for decreasing a number of transitions between adjacent two bits of the input data in accordance with the first data to output second data of 8 bits;

a DC balance circuit for keeping balance between a number of bits having the first level and a number of bits having the second level in the output data of 10 bits in accordance with the first and second data to output third data which constitutes another portion of the output data, said DC balance circuit including a register for storing history of a half of a difference between a number of bits having the first level and a number of bits having the second level in the output data to an amount of 4 bits, a number-of-levels difference computation circuit for computing a half of a difference between a number of bits having the first level and a number of bits having the second level in the second data, a condition decision circuit for receiving the first data, data output from said register and data output from said number-of-levels difference computation circuit to generate condition data, a bit inversion circuit for inverting the data output from said number-of-levels difference computation circuit in accordance with the condition data, and an addition Circuit for computing a sum of the first data, the data output froni said register and data output from said bit inversion circuit to output the computed sum to said register; and an output inversion circuit for inverting the second data in accordance with the third data to output fourth data which constitutes the other portion of the output data.

14. A semiconductor integrated circuit according to claim 13, wherein said number-of-levels difference computation circuit receives predetermined 4 bits within the input data of 8 bits in addition to the second data output ftom said number-of-transitions decrease circuit.

15. A semiconductor integrated circuit according to claim 13, wherein said number-of-transitions decrease circuit includes:

a first circuit for decreasing the number of transitions between adjacent two bits of the input data in a case where the number of bits having the first level is larger than a predetermined value;

a second circuit for decreasing the number of transitions between adjacent two bits of the input data in a case where the number of bits having the second level is larger than a predetermined value; and a selector for selecting one of data output from said first circuit and data output from said second circuit in accordance with the first data output from said number-of-levels comparison circuit;

wherein said first and/or second circuits perform parallel processing, thereby to decrease a number of stages of XOR gates and/or a number of stages of XNOR gates to be connected in series.

16. A semiconductor integrated circuit according to claim 13, wherein said number-of-transitions decrease circuit includes:

one of a first circuit for decreasing the number of transitions between adjacent two bits of the input data in a case where the number of bits having the first level is larger than a predetermined value and a second circuit for decreasing the number of transitions between adjacent two bits of the input data in a case where the number of bits having the second level is larger than a predetermined value; and a bit inversion circuit for inverting predetermined 4 bits within 8 bits of data output from said one of first and second circuits in accordance with the first data output from said number-of-levels comparison circuit;

wherein said one of first and second circuits performs parallel processing, thereby to decrease one of a number of stages of XOR gates and a number of stages of XNOR gates to be connected in series.

17. A semiconductor integrated circuit according to claim 13, wherein said one of the number of stages of XOR gates and the number of stages of XNOR gates to be connected in series is at most three.

18. A semiconductor integrated circuit for coding input data of 8 bits into output data of 10 bits, said semiconductor integrated circuit comprising:

a number-of-levels comparison circuit for comparing a number of bits having a first level and a number of bits having a second level in predetermined bits of the input data to output first data which constitutes a portion of the output data;

a number-of-transitions decrease circuit for decreasing a number of transitions between adjacent two bits of the input data in accordance with the first data to output second data of 8 bits;

a DC balance circuit for keeping balance between a number of bits having the first level and a number of bits having the second level in the output data of 10 bits in accordance with the first and second data to output third data which constitutes another portion of the output data, said DC balance circuit including a number-of-levels difference computation circuit for computing a half of a difference between a number of bits having the first level and a number of bits having the second level in the second data, said number-of-levels difference computation circuit receiving predetermined 4 bits within the input data of 8 bits in addition to the second data; and an output inversion circuit for inverting the second data in accordance with the third data to output fourth data which constitutes the other portion of the output data.

19. A semiconductor integrated circuit for coding input data of 8 bits into output data of 10 bits, said semiconductor integrated circuit comprising:

a number-of-levels comparison circuit for comparing a number of bits having a first level and a number of bits having a second level in predetermined bits of the input data to output first data which constitutes a portion of the output data;

a number-of-transitions decrease circuit for decreasing a number of transitions between adjacent two bits of the input data in accordance with the first data to output second data of 8 bits, said number-of-transitions decrease circuit including a first circuit for decreasing the number of transitions between adjacent two bits of the input data in a case where the number of bits having the first level is larger than a predetermined value, a second circuit for decreasing the number of transitions between adjacent two bits of the input data in a case where the number of bits having the second level is larger than a predetermined value, and a selector for selecting one of data output from said first circuit and data output from said second circuit in accordance with the first data, said first and/or second circuits performing parallel processing, thereby to decrease a number of stages of XOR gates and/or a number of stages of XNOR gates to be connected in series;

a DC balance circuit for keeping balance between a number of bits having the first level and a number of bits having the second level in the output data of 10 bits in accordance with the first and second data to output third data which constitutes another portion of the output data; and an output inversion circuit for inverting the second data in accordance with the third data to output fourth data which constitutes the other portion of the output data.

20. A semiconductor integrated circuit for coding input data of 8 bits into output data of 10 bits, said semiconductor integrated circuit comprising:

a number-of-levels comparison circuit for comparing a number of bits having a first level and a number of bits having a second level in predetermined bits of the input data to output first data which constitutes a portion of the output data;

a number-of-transitions decrease circuit for decreasing a number of transitions between adjacent two bits of the input data in accordance with the first data to output second data of 8 bits, said number-of-transitions decrease circuit including one of (i) a first circuit for decreasing the number of transitions between adjacent two bits of the input data in a case where the number of bits having the first level is larger than a predetermined value and (ii) a second circuit for decreasing the number of transitions between adjacent two bits of the input data in a case where the number of bits having the second level is larger than a predetermined value, and a bit inversion circuit for inverting predetermined 4 bits within 8 bits of data output from said one of first and second circuits in accordance with the first data, said one of first and second circuits performing parallel processing, thereby to decrease one of a number of stages of XOR gates and a number of stages of XNOR gates to be connected in series;

a DC balance circuit for keeping balance between a number of bits having the first level and a number of bits having the second level in the output data of 10 bits in accordance with the first and second data to output third data which constitutes another portion of the output data; and an output inversion circuit for inverting the second data in accordance with the third data to output fourth data which constitutes the other portion of the output data.

* * * * *